United States Patent
Koike

(10) Patent No.: US 9,293,402 B2
(45) Date of Patent: Mar. 22, 2016

(54) DEVICE WITH PILLAR-SHAPED COMPONENTS

(71) Applicant: LAPIS SEMICONDUTOR CO., LTD., Yokohama-shi, Kanagawa (JP)

(72) Inventor: Osamu Koike, Yokohama (JP)

(73) Assignee: LAPIS SEMICONDUCTOR CO., LTD., Kouhoku-Ku, Yokohama-Shi, Kanagawa (JP)

( * ) Notice: Subject to any disclaimer, the term of this patent is extended or adjusted under 35 U.S.C. 154(b) by 0 days.

(21) Appl. No.: 13/861,073

(22) Filed: Apr. 11, 2013

(65) Prior Publication Data

US 2013/0270697 A1    Oct. 17, 2013

(30) Foreign Application Priority Data

Apr. 13, 2012 (JP) .................................. 2012-091951
Apr. 13, 2012 (JP) .................................. 2012-091952
Apr. 13, 2012 (JP) .................................. 2012-091953

(51) Int. Cl.
| | |
|---|---|
| *H01L 23/367* | (2006.01) |
| *H01L 23/498* | (2006.01) |
| *H01L 21/56* | (2006.01) |

(Continued)

(52) U.S. Cl.
CPC ........ *H01L 23/49811* (2013.01); *H01L 21/561* (2013.01); *H01L 23/3114* (2013.01); *H01L 23/3677* (2013.01); *H01L 24/05* (2013.01);

(Continued)

(58) Field of Classification Search
CPC ........... H01L 2924/00014; H01L 2224/32225; H01L 2924/00; H01L 2924/00012; H01L 2924/014; H01L 23/49811; H01L 23/367

USPC .................. 257/737, 777, 779, 751, E21.506
See application file for complete search history.

(56) References Cited

U.S. PATENT DOCUMENTS

| | | | |
|---|---|---|---|
| 5,599,193 A | * | 2/1997 | Crotzer ........................ 439/66 |
| 7,569,935 B1 | * | 8/2009 | Fan ................................ 257/737 |
| 2003/0038343 A1 | | 2/2003 | Hasegawa |

FOREIGN PATENT DOCUMENTS

| | | |
|---|---|---|
| JP | 2002299496 | 10/2002 |
| JP | 2003-060120 A | 2/2003 |

(Continued)

OTHER PUBLICATIONS

Japanese Office Action Dated Aug. 7, 2012 in Connection With Counterpart Japanese Patent Application No. 2012-091952.

(Continued)

*Primary Examiner* — Chuong A Luu
*Assistant Examiner* — Rodolfo Fortich
(74) *Attorney, Agent, or Firm* — Volentine & Whitt, PLLC

(57) ABSTRACT

A device with pillar-shaped components, includes a substrate; a wiring layer disposed on the substrate; and pillar-shaped components disposed on any of the substrate and the wiring layer, each of the pillar-shaped components having a bottom part connected to the substrate and/or the wiring layer, a top part opposed to the bottom part, and a lateral face part extending from the bottom part and connected to the top part; wherein each of the pillar-shaped components includes a first pillar-shaped part formed by plating, a second pillar-shaped part formed on the first pillar-shaped part by plating, and a ring-like projection part formed on the lateral face part to project outward and extend in a circumferential direction, and to be in a position higher than a joint position between the first pillar-shaped part and the second pillar-shaped part.

14 Claims, 21 Drawing Sheets

(51) Int. Cl.
*H01L 23/31* (2006.01)
*H01L 23/00* (2006.01)

(52) U.S. Cl.
CPC ............ *H01L 2224/04042* (2013.01); *H01L 2224/48463* (2013.01)

(56) References Cited

FOREIGN PATENT DOCUMENTS

| JP | 2003-347471 A | 12/2003 |
| JP | 2004172163 | 6/2004 |
| JP | 2005-005453 A | 1/2005 |
| JP | 2005503020 | 1/2005 |
| JP | 2005-236188 A | 9/2005 |

OTHER PUBLICATIONS

Japanese Office Action dated Oct. 13, 2015, JP Application No. 2012-019151.
Japanese Office Action dated Oct. 13, 2015, JP Application No. 2012-019153.

* cited by examiner

COMPARISON EXAMPLE

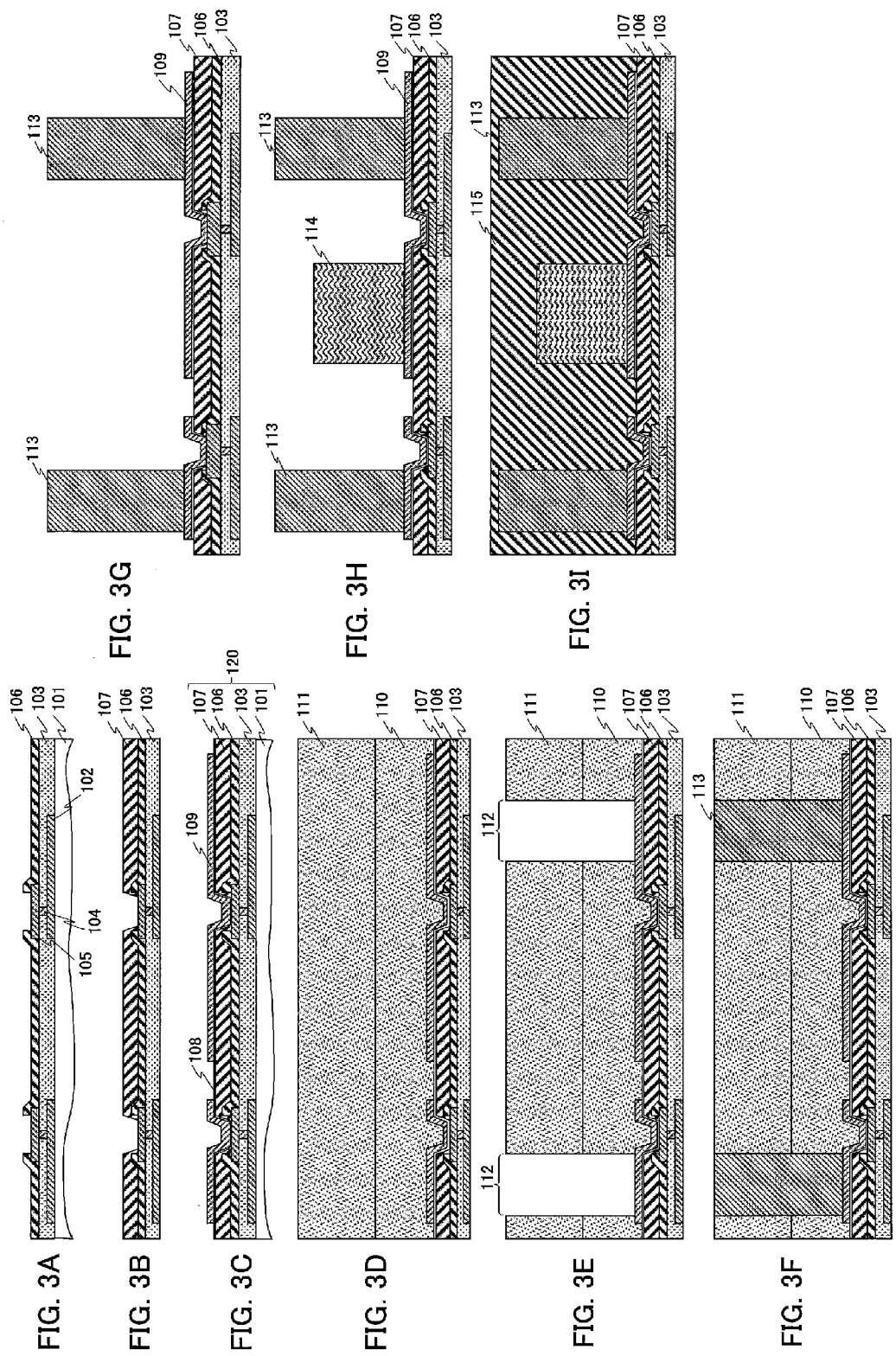

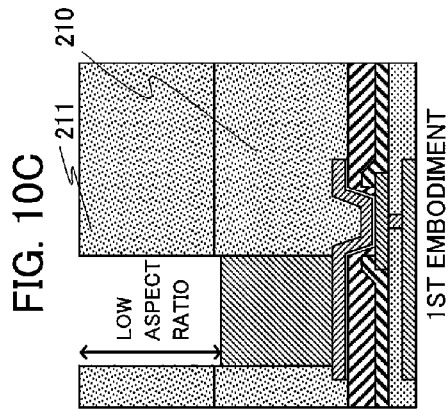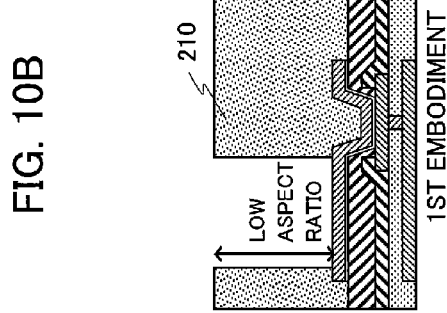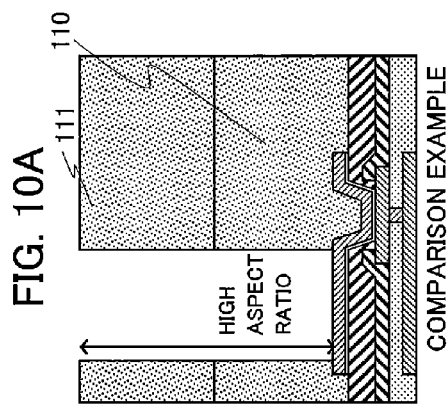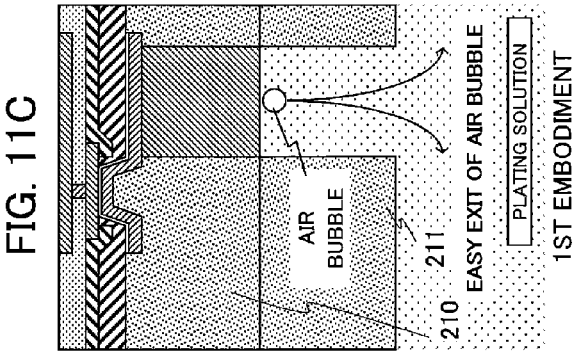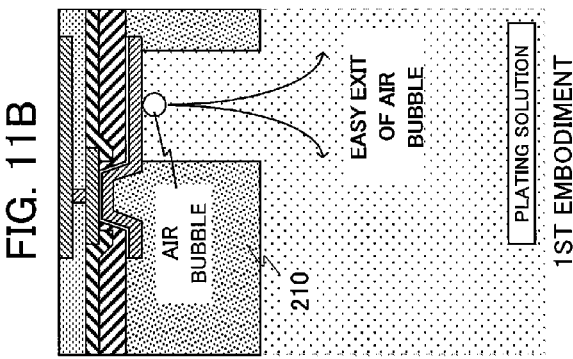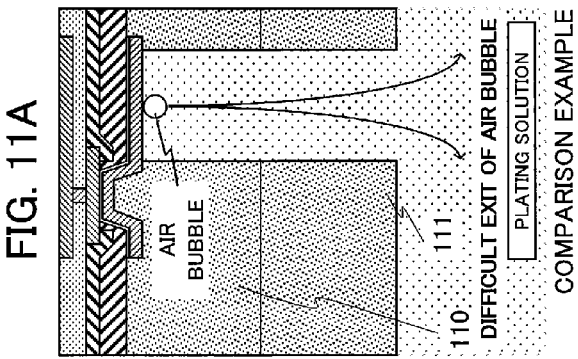

COMPARISON EXAMPLE

ENLARGED VIEW OF A

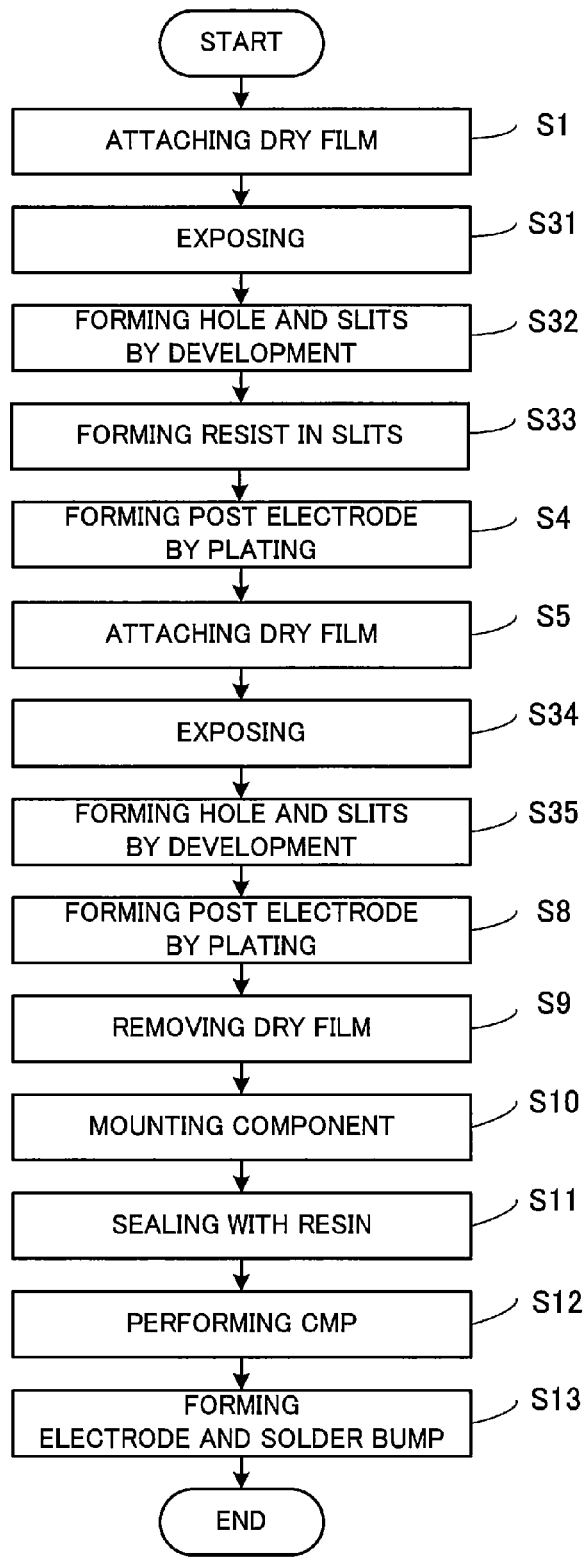

2ND EMBODIMENT

COMPARISON EXAMPLE

DEVICE WITH PILLAR-SHAPED COMPONENTS

BACKGROUND OF THE INVENTION

1. Field of the Invention

The present invention relates to a device with pillar-shaped components, and in particular, relates to an electronic device with pillar-shaped components.

2. Description of the Related Art

Recently, electronic devices such as cellular phones and digital cameras have been downsized, and therefore smaller semiconductor devices have been highly demanded for being mounted in such electronic devices. To meet such a demand, a wafer-level chip size packaging technology for forming a wafer-level chip size package (WL-CSP) has been developed. The WL-CSP is formed as a small package of the same size as a chip size. Furthermore, development of WL-CSPs each having an additional component mounted in a sealing resin has been also promoted.

For example, Japanese Patent Application Publication No. 2002-299496 (Patent Document 1) discloses a semiconductor device manufacturing method including a step of forming a post electrode composed of a stack of two copper (Cu) layers and a step of mounting a capacitor as an additional component sealed in a sealing resin. According to the method of Patent Document 1, as illustrated in a flowchart of FIG. 1, a post electrode is formed by the following steps (A) to (C):

(A) A first Cu layer forming step including: forming a first resist film on a conductive film disposed on a semiconductor wafer (step S101); forming a hole by light-exposure and development (steps S102 and S103); forming the first Cu layer by plating (step S104); removing the first resist film (step S105); forming a temporary seal layer on the first Cu layer (step S106); and applying CMP to the first Cu layer and the temporary seal layer (step S107).

(B) A second Cu layer forming step including: forming a second resist film (step S108); forming a hole by light-exposure and development (steps S109 and S110); forming the second Cu layer by plating (step S111); removing the second resist film (step S112); forming a temporary seal layer on the second Cu layer (step S113); and applying CMP to the second Cu layer and the temporary seal layer (step S114).

(C) An electronic component mounting step including: removing the temporary seal layers (step S115); mounting a capacitor as an electronic component (step S116); forming an insulation layer (step S117); applying CMP to the capacitor and the insulation layer (step S118); and forming an electrode and a solder bump (step S119).

Furthermore, Japanese Patent Application Publication No. 2004-172163 (Patent Document 2) discloses a multilayered structure including a lower post electrode part (first post electrode part) and an upper post electrode part (second post electrode part) disposed on the lower post electrode part.

In the semiconductor device of Patent Document 1, a boundary position between the temporary seal layers as the first and second layers corresponds with a joint position between the first Cu layer and the second Cu layer. At the boundary position between the temporary seal layer as the first layer and the second temporary seal layer as the second layer, an undesirable ring-like projection part disposed at the boundary position between the temporary seal layers and extending in a circumferential direction is frequently formed on a lateral face part of the Cu post electrode composed of the first and second Cu layers.

Furthermore, in the semiconductor device of Patent Document 2, since a circumferential length of the second post electrode part is shorter than a circumferential length of the first post electrode part, a step (or a step-like part) is formed at a joint position between the first and second post electrode parts.

As described above, if a post electrode has a projection part or a step-like part disposed at the joint position between the layers (post electrode parts) made of copper whose mechanical strength is comparatively low, the projection part or the step-like part is subjected to internal stress caused by a substrate warpage or deformation. Therefore, the devices of Patent Documents 1 and 2 have a problem of a high frequency of occurrence of defective post electrodes, in which the post electrodes are fallen out or broken.

SUMMARY OF THE INVENTION

An object of the present invention is to provide a device with pillar-shaped components disposed on a substrate with less frequency of occurrence of defective pillar-shaped components.

According to an aspect of the present invention, a device with pillar-shaped components, includes a substrate; a wiring layer disposed on the substrate; and pillar-shaped components disposed on any of the substrate and the wiring layer, each of the pillar-shaped components having a bottom part connected to any of the substrate and the wiring layer, a top part opposed to the bottom part, and a lateral face part extending from the bottom part to the top part to connect the bottom part and the top part. Each of the pillar-shaped components includes a first pillar-shaped part formed by plating, a second pillar-shaped part formed on the first pillar-shaped part by plating, and a ring-like projection part formed on the lateral face part to project outward and extend in a circumferential direction, the ring-like projection part being formed in a position higher than a joint position between the first pillar-shaped part and the second pillar-shaped part.

According to the present invention, a frequency of occurrence of defective pillar-shaped components in a device with pillar-shaped components is reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A to 3I are schematic sectional views illustrating processes of the method of manufacturing the semiconductor device in the comparison example;

FIG. 10A is a diagram illustrating an aspect ratio in the comparison example;

FIGS. 10B and 10C are diagrams illustrating an aspect ratio in the first embodiment;

FIG. 11A is a diagram illustrating a plating process in the comparison example;

FIGS. 11B and 11C are diagrams illustrating a plating process in the first embodiment;

FIG. 20 is a flowchart illustrating a modified example of the method of manufacturing a device with pillar-shaped components according to the second embodiment;

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

A device according to the present invention includes a substrate; a wiring layer disposed on the substrate; and pillar-shaped components disposed on any of the substrate and the wiring layer. Each of the pillar-shaped components has a bottom part connected to any of the substrate and the wiring layer, a top part opposed to the bottom part, and a lateral face part extending from the bottom part to the top part to connect the bottom part and the top part. Furthermore, each of the pillar-shaped components includes a first pillar-shaped part formed by plating, a second pillar-shaped part formed on the first pillar-shaped part by plating, and a ring-like projection part formed on the lateral face part to project outward and extend in a circumferential direction, the ring-like projection part being formed in a position higher than a joint position between the first pillar-shaped part and the second pillar-shaped part.

The device may include an additional component formed on any of the substrate and the wiring layer so as to be mounted outside an area where the pillar-shaped components are disposed.

The pillar-shaped components disposed on the wiring layer are post electrodes. On the other hand, the pillar-shaped components disposed on the substrate may be pillar-shaped metal components for radiating heat.

Detailed descriptions will be made as to cases where a device with pillar-shaped components is a semiconductor device with post electrodes. However, the present invention may be applied to a device other than the semiconductor device or a device with pillar-shaped components other than the post electrodes.

First, a comparison example which is used for explaining the first and second embodiments of the present invention will be described, and then the first and second embodiments will be described. The comparison example and the first and second embodiments relate to a device with pillar-shaped components such as post electrodes that are formed so as to penetrate a molding resin as a sealing resin in a thickness direction when an additional component such as an electronic component is mounted on a re-distribution wiring layer disposed on a substrate and sealed with the molding resin in a WL-CSP, and also relates to a method of forming pillar-shaped components such as post electrodes.

《1》 Comparison Example

Figure 1:
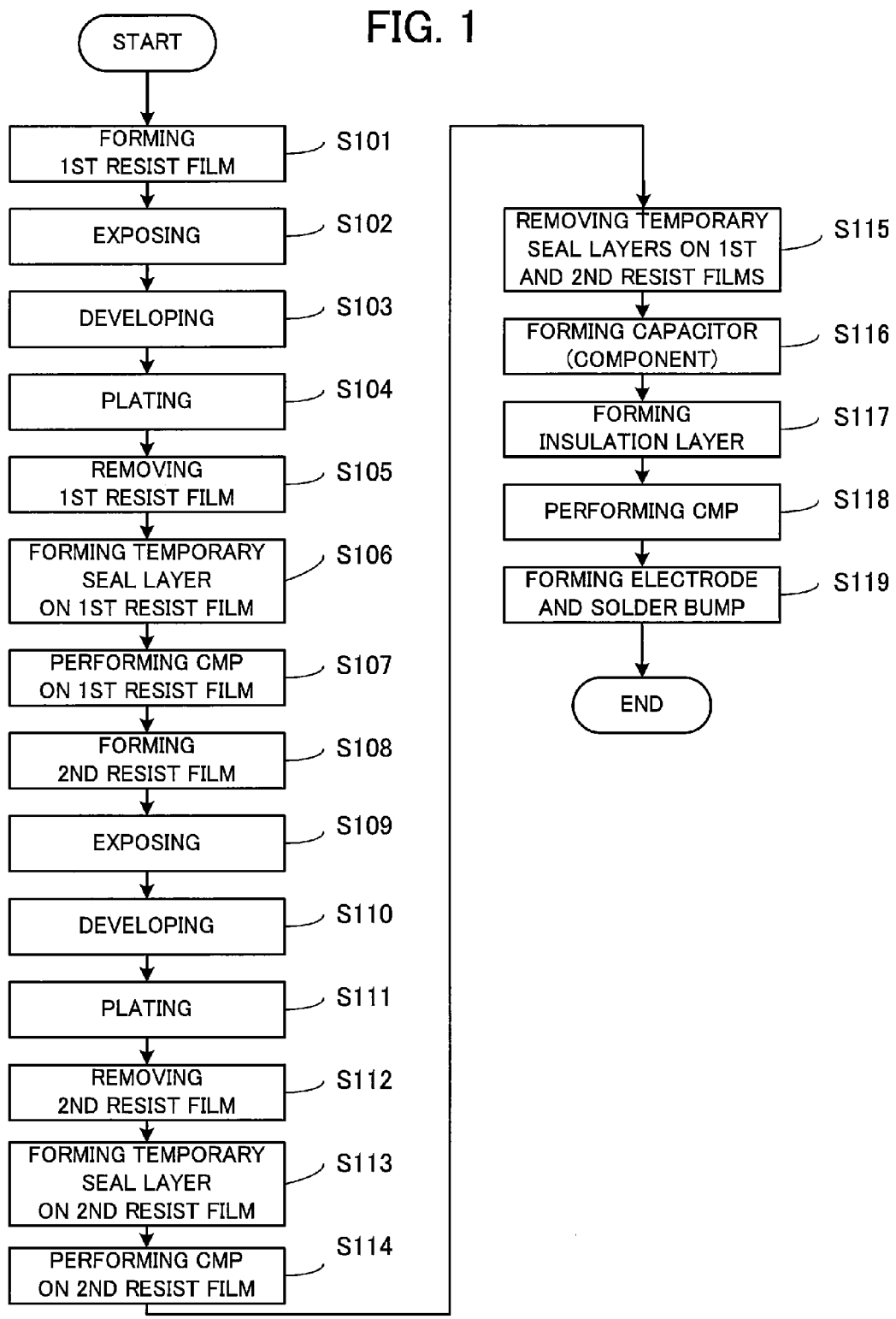
FIG. 1 is a flowchart illustrating a conventional post electrode forming method.
Figure 2:
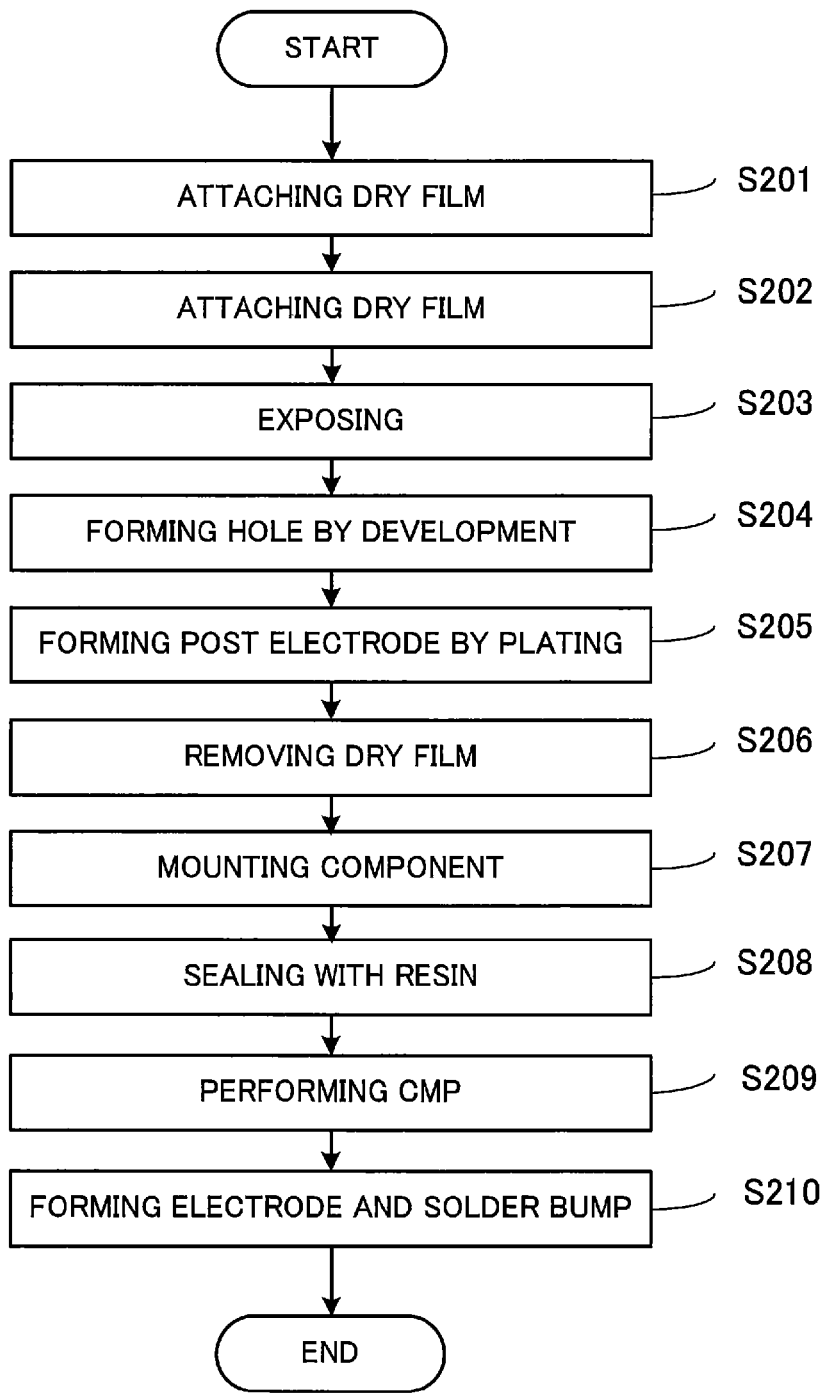
FIG. 2 is a flowchart illustrating a method of manufacturing a semiconductor device in a comparison example.
Figure 4A:
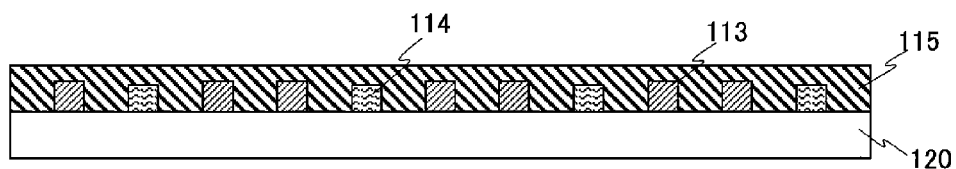
FIGS. 4A to 4D are schematic sectional views illustrating processes of the method of manufacturing the semiconductor device in the comparison example.

FIG. 2 is a flowchart illustrating a method of manufacturing a device with pillar-shaped components in the comparison example. FIGS. 3A to 3I are schematic sectional views illustrating processes of the method of manufacturing the device with pillar-shaped components in the comparison example, and FIGS. 4A to 4D are schematic sectional views illustrating processes of the method of manufacturing the device with pillar-shaped components in the comparison example. The process illustrated in FIG. 4A is a process subsequent to the process illustrated in FIG. 3I. Furthermore, FIG. 5 is a schematic sectional view illustrating the device with pillar-shaped components in the comparison example. The method of manufacturing the device with pillar-shaped components in the comparison example will be described below, by referring to the drawings.

FIG. 3A illustrates a semiconductor wafer which is obtained after a wafer process including an impurity diffusion process is finished. In FIG. 3A, a wiring layer 102 and an interlayer dielectric film 103 are formed on the semiconductor wafer 101, a via (i.e., a via contact structure) 104 connected to the wiring layer 102 is formed in the interlayer dielectric film 103, and a wiring layer 105 connected to the via 104 and a passivation film 106 coating the interlayer dielectric film 103 are formed.

Next, as illustrated in FIG. 3B, a lower dielectric film 107 is formed on the passivation film 106, and then an opening is formed in the lower dielectric film 107 so as to correspond to an opening on the passivation film 106.

Next, as illustrated in FIG. 3C, an under barrier metal (UBM) film 108 is formed on the entire surface of the wafer. Then, a resist film (not illustrated in the drawings) is formed on the entire surface of the wafer and a pattern of openings is formed in the resist film for forming a re-distribution wiring layer 109 by using lithographic techniques. The re-distribution wiring layer 109 is formed by plating only on an area without the resist film. Thereafter, the resist film is removed by an ashing process.

Next, as illustrated in FIG. 3D, a first photoresist dry film 110 is attached to the entire surface of the wafer on which the re-distribution wiring layer 109 is formed (step S201 in FIG. 2), and then a second photoresist dry film 111 is attached to an upper surface of the first photoresist dry film 110 (step S202 in FIG. 2). In the following explanation, the photoresist dry film will be also referred to as 'dry film'. Furthermore, a thickness of the dry film 110 is 120 μm, for example.

Next, as illustrated in FIG. 3E, light-exposure and development processes are carried out by using lithographic techniques to form openings (i.e., holes) 112 on the re-distribution wiring layer 109 so that the openings 112 penetrate the first and second dry films 110 and film 111 in a thickness direction of the first and second dry films 110 and 111 (steps S203 and S204 in FIG. 2).

Next, as illustrated in FIG. 3F, post electrodes 113 as pillar-shaped components made of copper is formed in the openings 112 by plating such as electroplating. In FIG. 3, the post electrodes 113 are formed only in the openings 112 formed in the dry film (step S205 in FIG. 2).

Next, as illustrated in FIG. 3G, the second and first dry films 111 and 110 are removed by carrying out chemical liquid treatment, and then the UBM film 108 is partially removed while the re-distribution wiring layer 109 functions as a stopper film (step S206 in FIG. 2).

Next, as illustrated in FIG. 3H, an additional component 114 is mounted on the re-distribution wiring layer 109 (step S207 in FIG. 2). The additional component 114 is an electronic component such as a light-emitting device, a light-receiving device, or other devices. There are no restrictions on the kind and the number of the additional components 114.

Then, as illustrated in FIG. 3I and FIG. 4A, the entire surface of the wafer is sealed with a molding resin 115 (step S208 in FIG. 2).

Figure 4B:
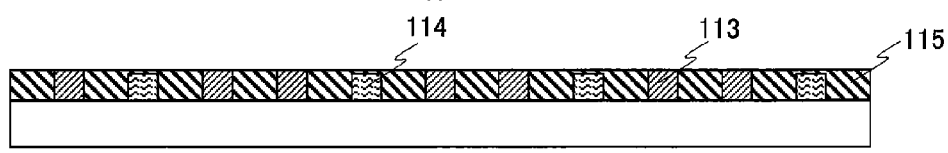
Figure 5:
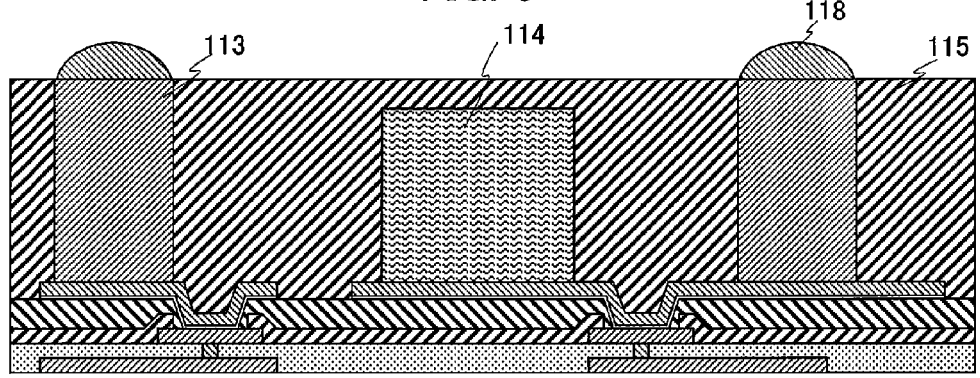
FIG. 5 is a schematic sectional view illustrating a semiconductor device as a device with pillar-shaped components in the comparison example.

Next, as illustrated in FIG. 4B, a Si wafer 120 resultant from the sealing with the molding resin 115 is ground by using a CMP method so that top parts of the post electrodes 113 are exposed (step S209 in FIG. 2). At this time, the post electrodes 113 are formed so that each of the top parts of the post electrodes 113 is higher than a top part of the additional component 114. A height of each of the post electrodes 113 can be increased by increasing the number of dry films of a multilayered structure of photoresist dry films (i.e., multilayered dry film structure).

Figure 4C:
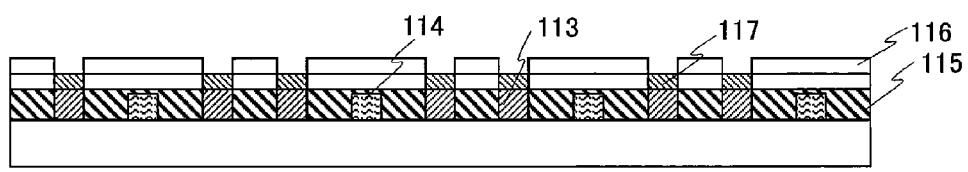
Figure 4D:
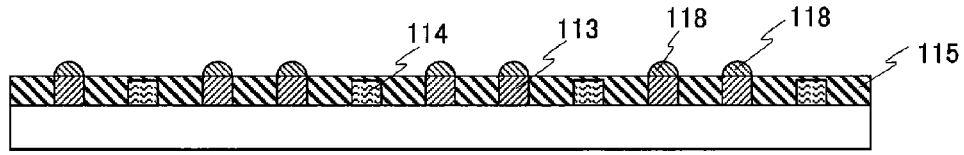

Then, as illustrated in FIG. 4C, a solder mask 116 is disposed and a solder paste 117 is printed on the post electrode 113. As illustrated in FIG. 4D, the solder mask 116 is removed, and then a reflow process is carried out so that hemisphere-shaped solder terminals 118 are formed (step S210 in FIG. 2).

The WL-CSP device with pillar-shaped components in which the additional component is mounted on the re-distribution wiring layer and sealed with the molding resin is thus manufactured by the above-described processes, and the WL-CSP illustrated in FIG. 5 has been completed.

《2》 First Embodiment

《2-1》 Manufacturing Method

Figure 6:
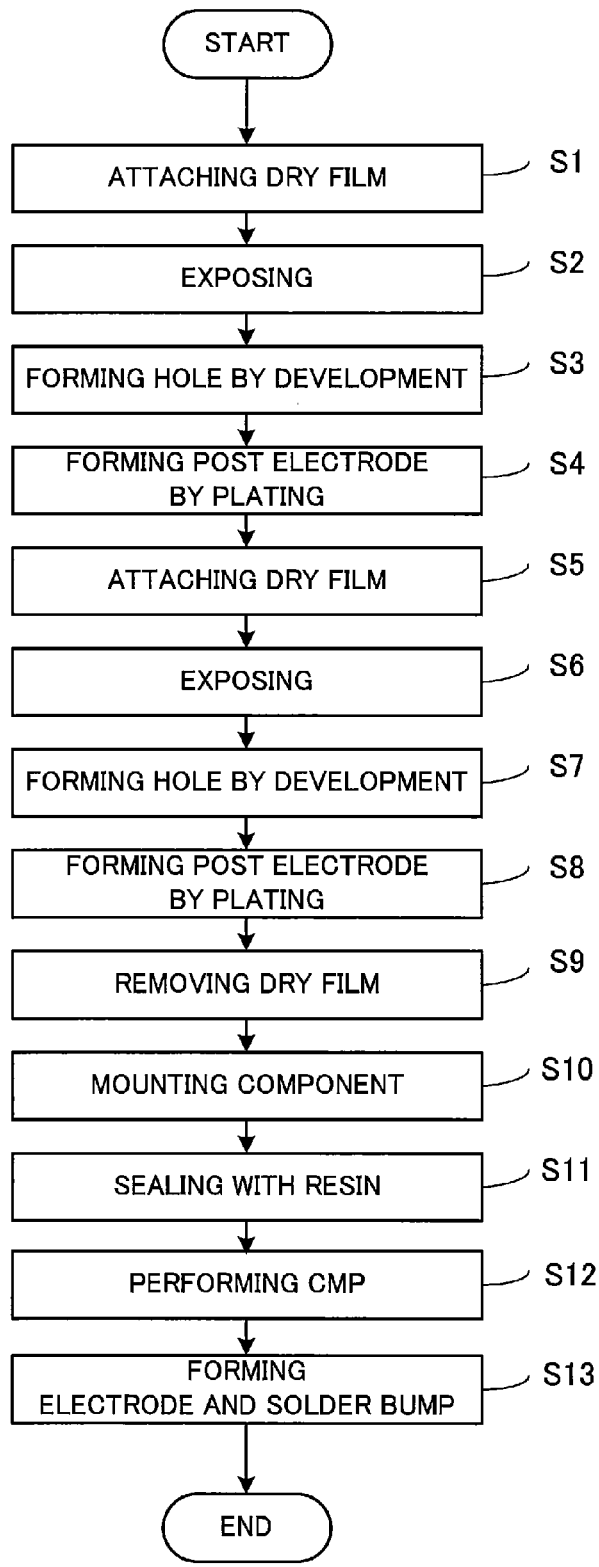
FIG. 6 is a flowchart illustrating a method of manufacturing a device with pillar-shaped components according to a first embodiment of the present invention.

FIG. 6 is a flowchart illustrating a method of manufacturing a device with pillar-shaped components according to the first embodiment. FIGS. 7A to 7E are schematic sectional views illustrating processes of the method of manufacturing the device with pillar-shaped components according to the first embodiment, FIGS. 8A to 8D are schematic sectional views illustrating processes of the method of manufacturing the device with pillar-shaped components according to the first embodiment, and FIGS. 9A to 9C are schematic sectional views illustrating processes of the method of manufacturing the device with pillar-shaped components according to the first embodiment. The process illustrated in FIG. 8A is a process subsequent to the process illustrated in FIG. 7E, and the process illustrated in FIG. 9A is a process subsequent to the process illustrated in FIG. 8D. Furthermore, FIGS. 10A to 10C are schematic sectional views illustrating aspect ratios, and FIGS. 11A to 11C are diagrams illustrating plating processes in structures illustrated in FIGS. 10A to 10C.

Figure 7A:
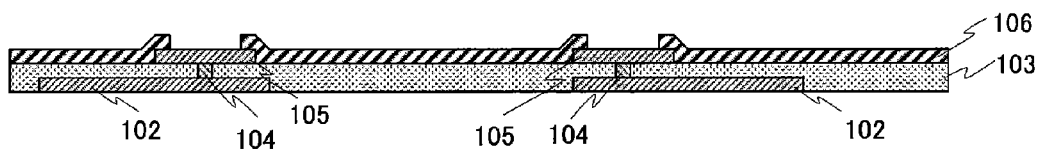
FIGS. 7A to 7E are schematic sectional views illustrating processes of the method of manufacturing a device with pillar-shaped components according to the first embodiment.
Figure 8A:
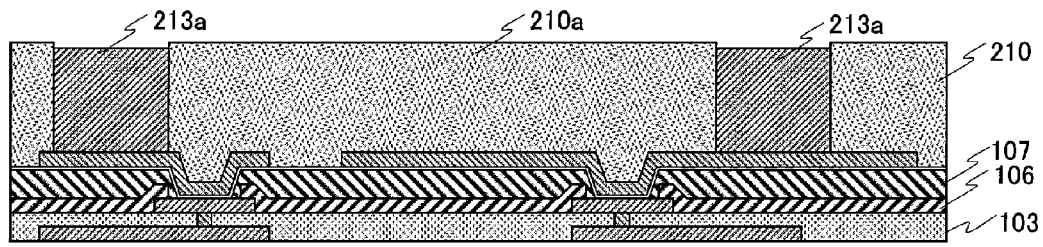
FIGS. 8A to 8D are schematic sectional views illustrating processes of the method of manufacturing the device with pillar-shaped components according to the first embodiment.

FIG. 7A illustrates a semiconductor wafer which is obtained after a wafer process including an impurity diffusion process and other processes is finished. In FIG. 7A, the wiring layer 102 and the interlayer dielectric film 103 are formed on the semiconductor wafer 101, the via 104 (i.e., via contact structure) connected to the wiring layer 102 is formed in the interlayer dielectric film 103, and the wiring layer 105 connected to the via 104 and the passivation film 106 coating the interlayer dielectric film 103 are formed.

Figure 7B:
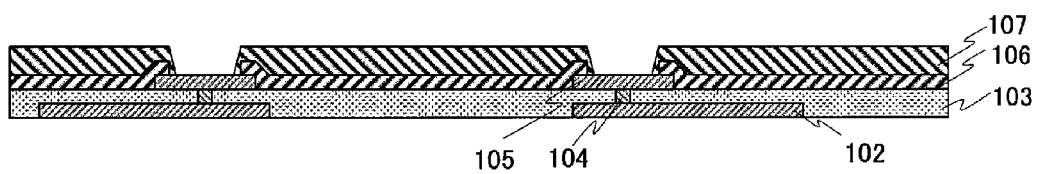

Next, as illustrated in FIG. 7B, the lower dielectric film 107 is formed, and then an opening is formed in the lower dielectric film 107 so as to correspond to an opening in the passivation film 106.

Figure 7C:
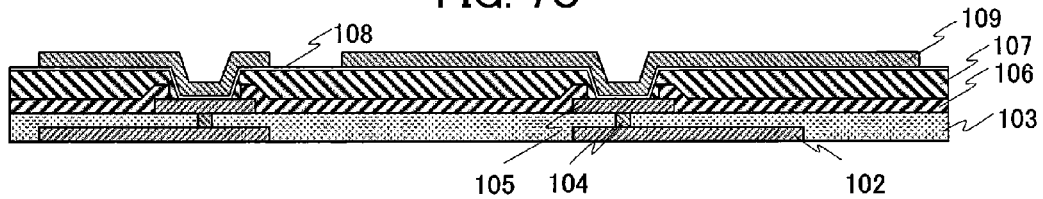

Next, as illustrated in FIG. 7C, the UBM film 108 is formed on the entire surface of the wafer. Then, a resist film (not illustrated in the drawing) is formed on the entire surface of the wafer and a pattern of openings is formed in the resist film for forming a re-distribution wiring layer 109 by using lithographic techniques. The re-distribution wiring layer 109 is formed by plating such as electroplating only in the openings of the resist film (i.e., on areas without the resist film), and then the resist film is removed by an ashing process.

Figure 7D:
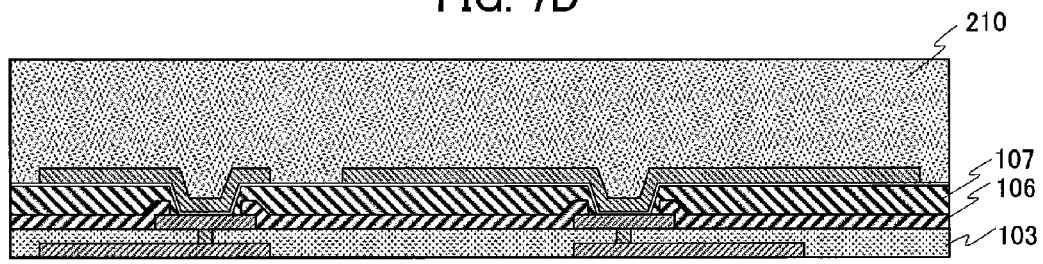

Next, as illustrated in FIG. 7D, a first dry film 210 is attached to the entire surface of the wafer on which the re-distribution wiring layer 109 is formed (step S1 in FIG. 6).

Figure 7E:
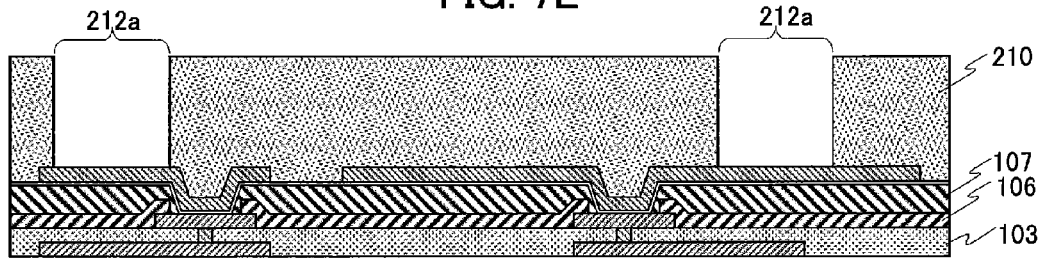

Next, as illustrated in FIG. 7E, openings (i.e., holes) 212a are formed in the re-distribution wiring layer 109 by using lithographic techniques so that the openings 212a penetrate the first dry film 210 in a thickness direction of the first dry film 210 (steps S2 and S3 in FIG. 6).

Next, as illustrated in FIG. 8A, first post electrode parts 213a as first pillar-shaped parts are formed by plating such as electroplating (step S4 in FIG. 6). Copper (Cu) electrodes are usually used as the first post electrode parts 213a. However, another metal such as gold or palladium may be also used as the first post electrode parts 213a. At this time, the first post electrode parts 213a are formed only in the opening 212a of the first dry film 210. As illustrated in FIG. 8A, the first post electrode parts 213a are formed so that upper surfaces of the first post electrode parts 213a are lower than an upper surface 210a of the first dry film 210.

Figure 8B:
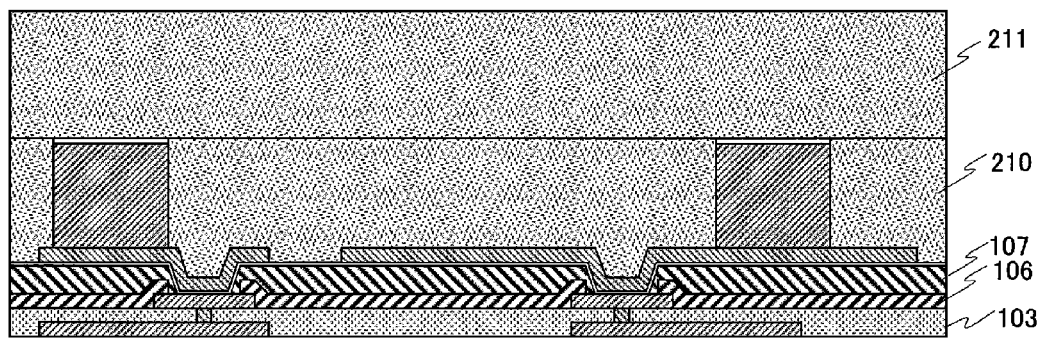
Figure 9A:
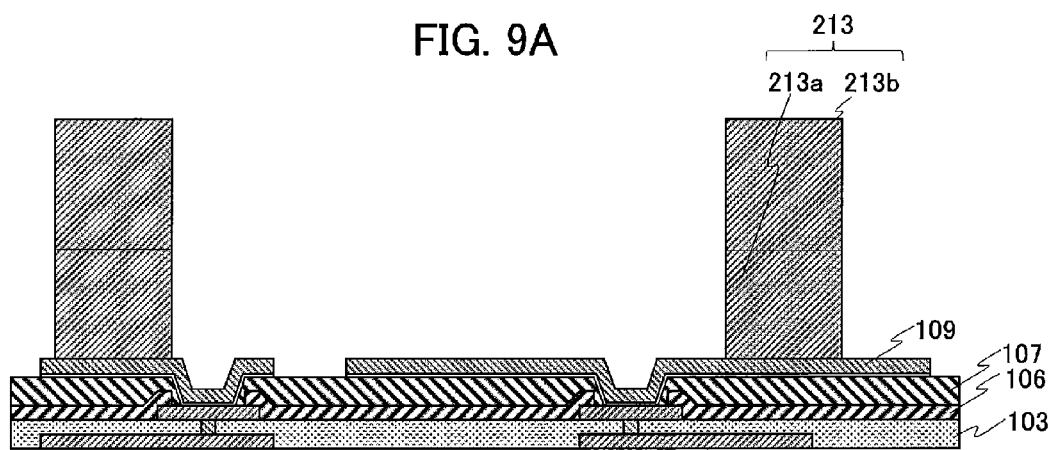
FIGS. 9A to 9C are schematic sectional views illustrating processes of the method of manufacturing the device with pillar-shaped components according to the first embodiment.
Figure 9B:
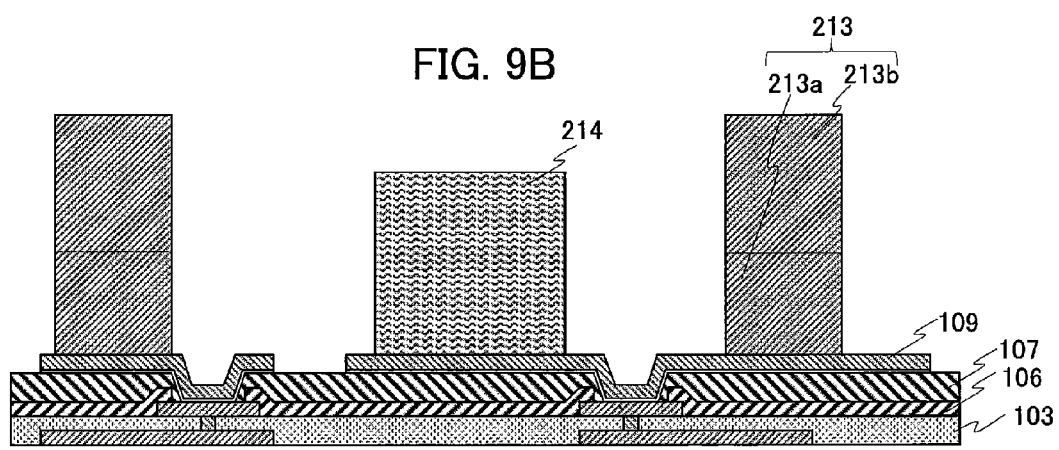
Figure 9C:
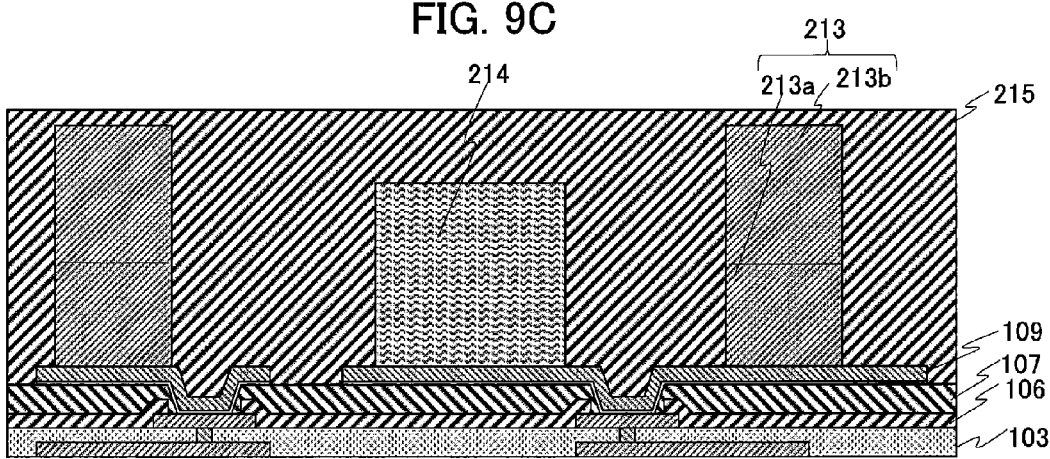

Next, as illustrated in FIG. 8B, a second dry film 211 is attached to the entire surface of the wafer (step S5 in FIG. 6).

Figure 8C:
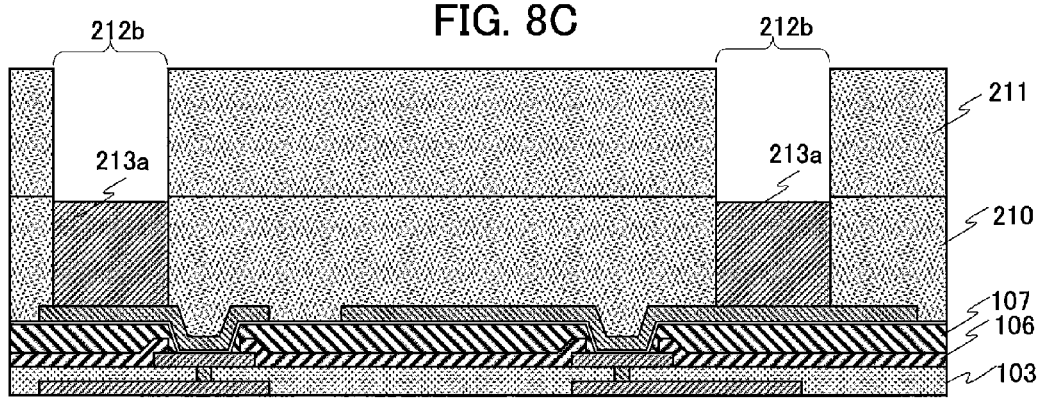

Next, as illustrated in FIG. 8C, openings (i.e., holes) 212b are formed in the second dry film 211 over the openings 212a of the first dry film 210 by using lithographic techniques so that the openings 212b correspond with the openings 212a (steps S6 and S7 in FIG. 6) respectively. The openings 212b penetrate the second dry film 211 in a thickness direction of the second dry film 211.

Figure 8D:
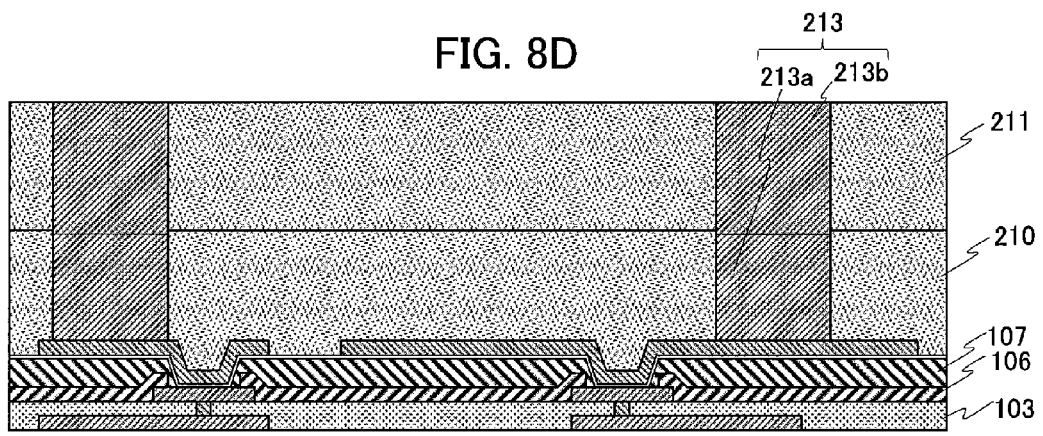

Next, as illustrated in FIG. 8D, second post electrode parts 213b as second pillar-shaped parts are formed on the first post electrode parts 213a respectively by plating such as electroplating (step S8 in FIG. 6). A copper (Cu) electrode is usually used as the second post electrode parts 213b. However, another metal such as gold or palladium may be also used as the second post electrode parts 213b. At this time, the second post electrode parts 213b are formed only in the openings 212b of the second dry film 211. It is desirable that the second post electrode parts 213b should be formed to be higher than an upper surface of the second dry film 211. If a plurality of second post electrode parts 213b is formed on a semiconductor wafer, a plating speed in a center part and a plating speed in a peripheral part on the semiconductor wafer are sometimes different from each other. To cope with this case, all of the second post electrode parts are formed so that all of them are higher than the upper surface of the second dry film 211. Multilayered structures of the first and second post electrode parts 213a and 213b are also referred to as post electrodes 213 as pillar-shaped components.

In a case where multilayered structures of three or more dry films are used, it is desirable that upper surfaces of the second post electrode parts 213b should be formed to be lower than the upper surface of the second dry film, in a similar manner to the upper surfaces of the first post electrode parts 213a.

Next, as illustrated in FIG. 9A, the second and first dry films 211 and 210 are removed by carrying out chemical liquid treatment (step S9 in FIG. 6), and then the UBM film 108 is partially removed while the re-distribution wiring layer 109 functions as a stopper film.

Next, as illustrated in FIG. 9B, an additional component 214 is mounted on the re-distribution wiring layer 109 (step S10 in FIG. 6). For example, the additional component 214 is a chip or a packaged electronic component such as a light-emitting device, a light-receiving device, an oscillation device, a sensor electronic component, or other components. There are no restrictions on the kind or the number of the additional components 214.

Then, as illustrated in FIG. 9C, the entire surface of the wafer is sealed with a molding resin 215 as a sealing resin (step S11 in FIG. 6). Then, the processes as illustrated in FIGS. 3A to 3D are carried out (steps S12 and S13 in FIG. 6). The WL-CSP device with pillar-shaped components in which the additional component 214 is mounted on the re-distribution wiring layer 109 or the substrate and sealed with the molding resin 215 is thus manufactured by the above-described processes.

《 2-2 》 Effects of First Embodiment

FIG. 10A illustrates an aspect ratio of a hole, i.e., a ratio of a depth to a width of the hole, in the comparison example; and FIGS. 10B and 10C illustrate an aspect ratio of a hole in the first embodiment. In the first embodiment, the first dry film 210 is used as a mask for forming the first post electrode parts 213a by plating, the second dry film 211 is used as a mask for forming the second post electrode parts 213b after the first post electrode parts 213a are formed, and thus the post electrodes 213 of sufficient height are formed. Thus, by performing the process for forming the post electrode parts a plurality of times (twice in this case), an aspect ratio of the hole of the dry film can be reduced in the post electrode forming process, in comparison with the comparison example illustrated in FIG. 10A.

Figure 12:
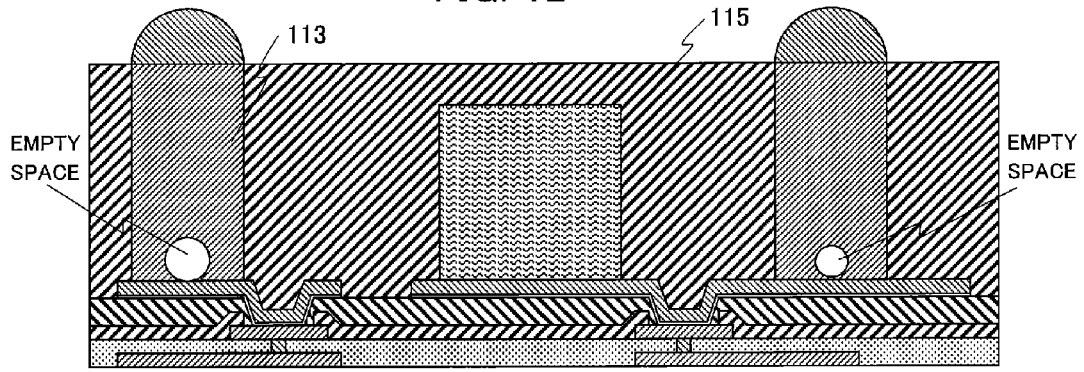
FIG. 12 is a diagram illustrating a problem in the comparison example.

As illustrated in FIG. 11A, if a hole (i.e., opening) of the dry film has a high aspect ratio, it is extremely difficult to remove air bubbles in the plating solution that remain in the opening when a cup-type plating apparatus without a deaerator for removing air bubbles in the plating solution is used for plating. The air bubbles remaining in the opening of the dry films 110 and 111 interferes with copper plating. In addition, if the plating is carried out for forming the post electrodes while a plating solution includes air bubbles, the resultant post electrodes 113 include defective hollow parts (i.e., empty spaces) inside as illustrated in FIG. 12. The hollow parts in the post electrode 113 seriously damage strength and reliability of the post electrodes 113 and cause a breakage of the post electrodes in the manufacturing processes or a defective product on the market.

According to the method in the first embodiment, even if an inexpensive plating apparatus such as a plating apparatus without a deaerator or a cup-type plating apparatus is used, air bubbles are easy to exit through (i.e., be removed from) the openings, as illustrated in FIGS. 11B and 11C. Therefore, the post electrodes (213 in FIG. 9C) are formed so the upper surfaces of the post electrodes are higher than the mounted additional component 214 without the problem of occurrence of defective hollow parts in the post electrodes 213.

Moreover, since the first post electrode parts 213a are formed so that the upper surfaces of the first post electrode parts 213a are lower than the upper surface of the first dry film 210 while the first dry film 210 is used as a mask, the post electrodes 213 can be prevented from falling out and weak adhesion when the second dry film 211 is attached to the first dry film 210 can be prevented.

Furthermore, top parts of the openings of the pattern of the first dry film 210 tend to be enlarged as a result of the developing process of the pattern of the first dry film 210. Accordingly, each of the post electrodes 213 has a projection part 240 slightly projecting toward the opening near an interface between the first dry film 210 and the second dry film 211. The projection part 240 can prevent the post electrode 213 from falling out from the molding resin 215.

As described above, in the first embodiment, the post electrodes 213 of a sufficient height are formed by performing each of the processes of dry film attaching and the post electrode parts forming by plating twice. Therefore, even if a simple and inexpensive plating apparatus is used, the post electrodes of a sufficient height for mounting an additional component can be obtained without defective hollow parts (i.e., empty spaces) inside the post electrodes 213.

Figure 13:
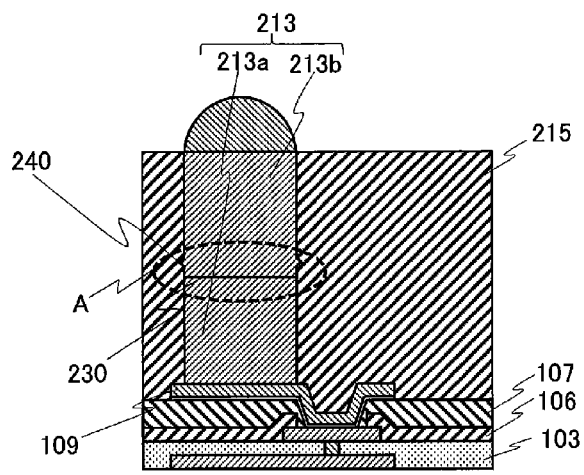
FIG. 13 is a schematic sectional view illustrating a pillar-shaped component in the device with pillar-shaped components according to the first embodiment.
Figure 14:
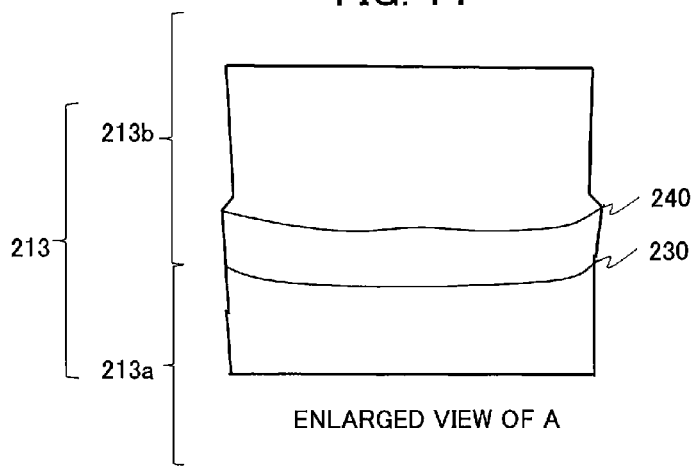
FIG. 14 is an enlarged view of an essential part in FIG. 13.

FIG. 13 is a schematic sectional view illustrating the post electrode 213 in the device with pillar-shaped components according to the first embodiment. FIG. 14 is an enlarged perspective view of an essential part 'A' in FIG. 13. As illustrated in FIG. 13, the pillar-shaped post electrode 213 includes a bottom part connected to the re-distribution layer 109 disposed on the semiconductor wafer, a top part being opposed to the bottom part, and a lateral face part joining the bottom part and the top part. In the first embodiment, a joint position 230 between the first post electrode part 213a and the second post electrode part 213b is lower than the interface between the first and second dry films 210 and 211. Near the interface between the first and second dry films 210 and 211, a ring-like projection part (step-like part) 240 is formed. The ring-like projection part projects outward and extends in a circumferential direction as illustrated in FIG. 14. Such a structure can prevent the problem of weak adhesion when the second dry film 211 is attached to the first dry film 210. Furthermore, the ring-like projection part 240 at the interface between the first and second dry films 210 and 211 can prevent the post electrode from falling out from the molding resin.

In addition, if third post electrode parts are formed on the second post electrode parts by using a third photoresist dry film (not illustrated in the drawings) which is layered on the second photoresist dry film 211, it is desirable to form a structure of the second and third post electrode parts that has a structure similar to that of the first and second post electrode parts 213a and 213b as illustrated in FIGS. 13 and 14.

《3》 Second Embodiment

《3-1》 Manufacturing Method

Figure 15:
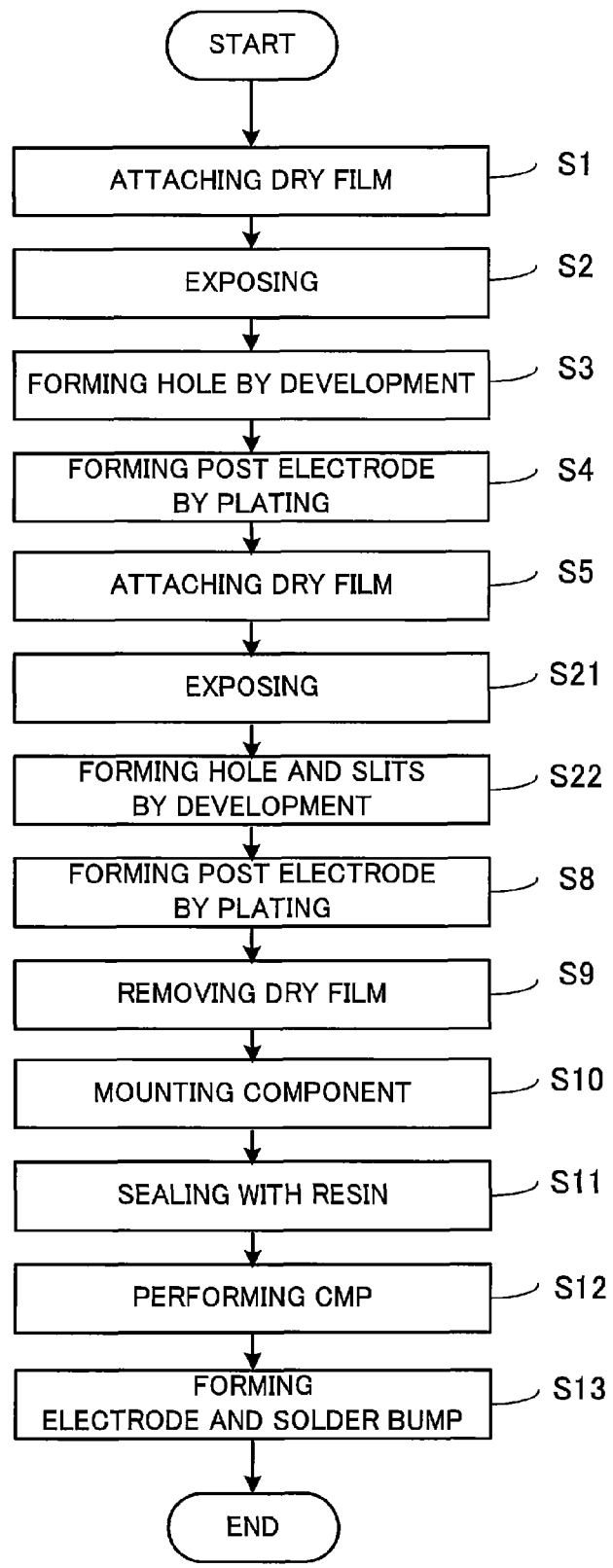
FIG. 15 is a flowchart illustrating a method of manufacturing a device with pillar-shaped components according to a second embodiment of the present invention.
Figure 17A:
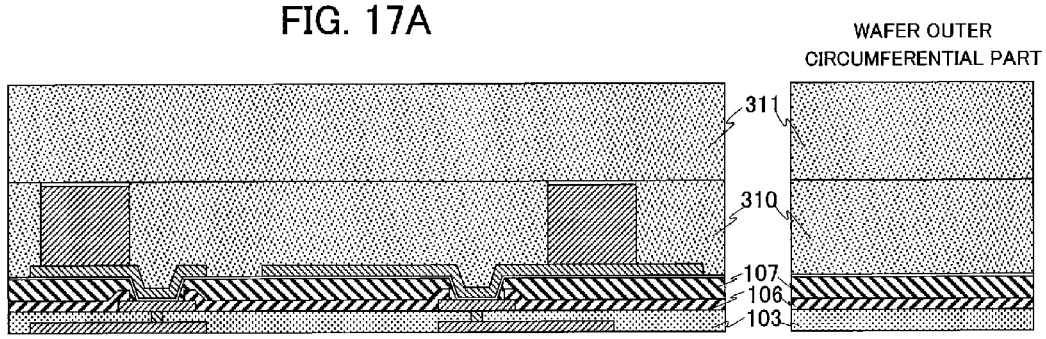
FIGS. 17A to 17D are schematic sectional views illustrating processes of the method of manufacturing the device with pillar-shaped components according to the second embodiment.
Figure 18A:
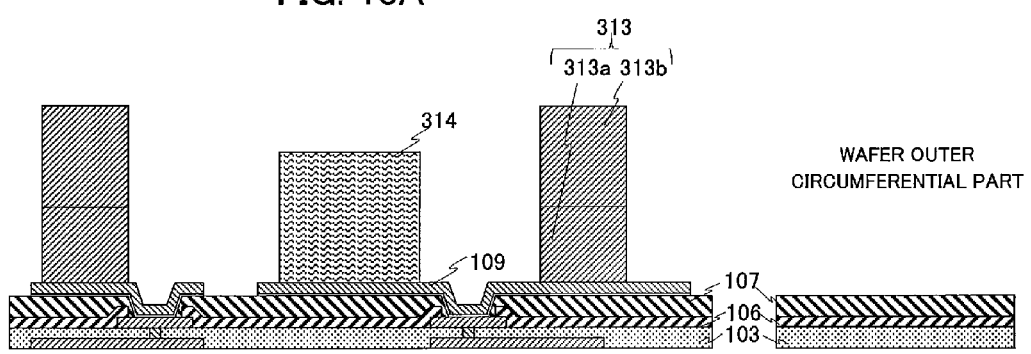
FIGS. 18A and 18B are schematic sectional views illustrating processes of the method of manufacturing the device with pillar-shaped components according to the second embodiment.
Figure 18B:
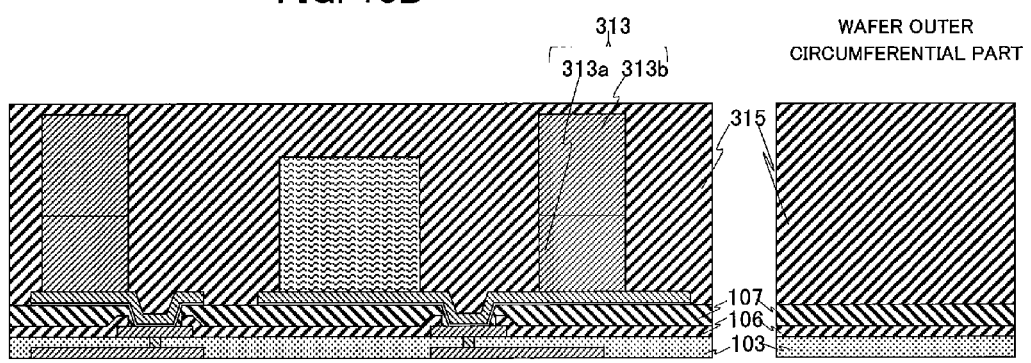
Figure 19:
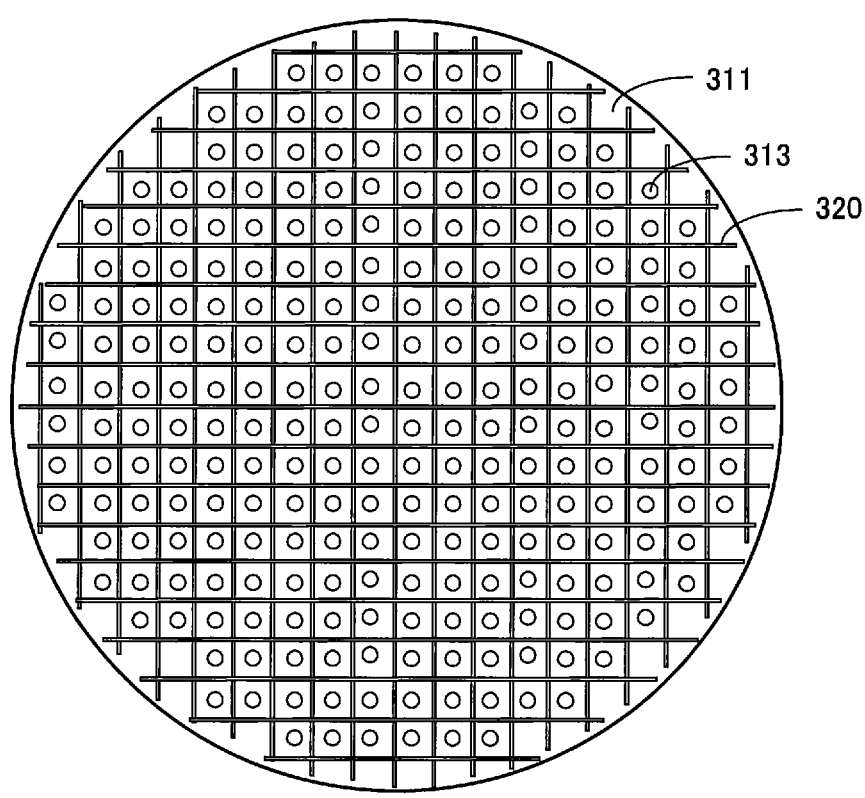
FIG. 19 is a plan view schematically illustrating forming slits in the method of manufacturing a device with pillar-shaped components according to the second embodiment.

FIG. 15 is a flowchart illustrating a method of manufacturing a device with pillar-shaped components according to the second embodiment. FIGS. 16A to 16D are schematic sectional views illustrating processes of the method of manufacturing the device with pillar-shaped components according to the second embodiment, FIGS. 17A to 17D are schematic sectional views illustrating processes of the method of manufacturing the device with pillar-shaped components according to the second embodiment, and FIGS. 18A and 18B are schematic sectional views illustrating processes of the method of manufacturing the device with pillar-shaped components according to the second embodiment. FIG. 17A illustrates the process subsequent to the process illustrated in FIG. 16D, and FIG. 18A illustrates the process subsequent to the process illustrated in FIG. 17D. In each of FIGS. 16A to 16D, FIGS. 17A to 17D and FIGS. 18A and 18B, a region in a center part (excluding an outer circumferential part) of a wafer is illustrated on the left and a region near the outer circumferential part of the wafer is illustrated on the right. Furthermore, FIG. 19 is a plan view schematically illustrating an example of forming slits.

Figure 16A:
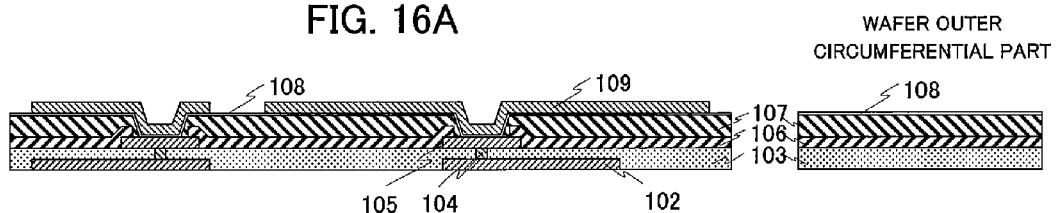
FIGS. 16A to 16D are schematic sectional views illustrating processes of the method of manufacturing a device with pillar-shaped components according to the second embodiment.

FIG. 16A illustrates a wafer fabricated by the same processes as the processes described in the first embodiment illustrated by referring to FIGS. 7A to 7C.

Figure 16B:
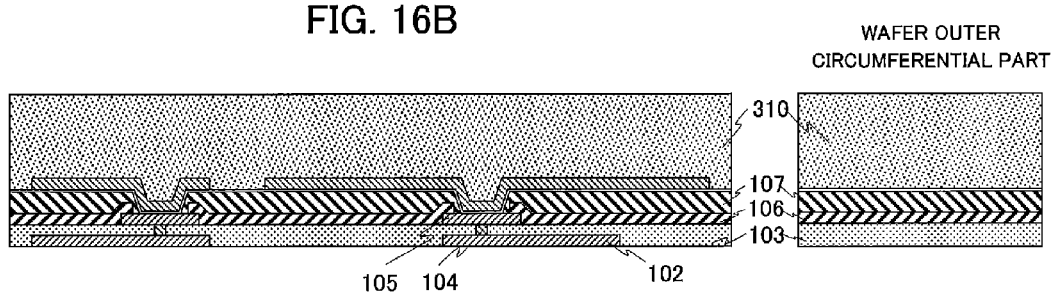

Next, as illustrated in FIG. 16B, a first dry film 310 is attached to the entire surface of the wafer on which the re-distribution wiring layer 109 is formed (step S1 in FIG. 15).

Figure 16C:
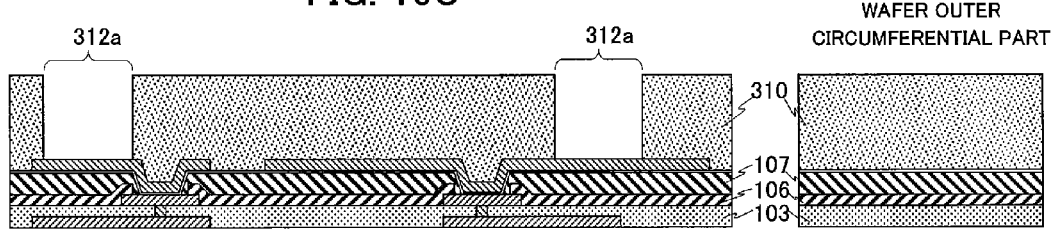
Figure 16D:
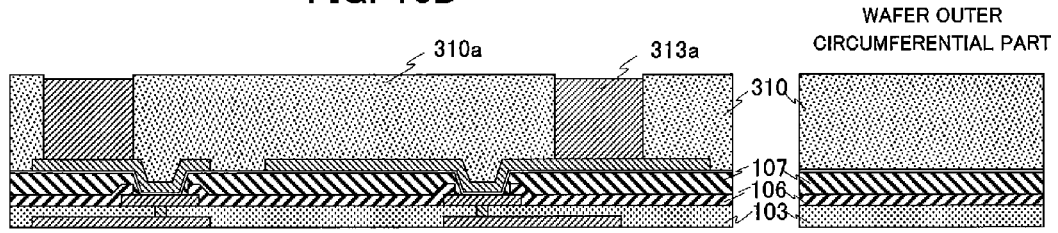

Next, as illustrated in FIG. 16C, openings (i.e., holes) 312a are formed in the re-distribution wiring layer 109 by using lithographic techniques (steps S2 and S3 in FIG. 15). The openings 312a penetrate the first dry film 310 in a thickness direction of the first dry film 310.

Next, as illustrated in FIG. 16D, first post electrode parts 313a as first pillar-shaped parts are formed by plating such as electroplating (step S4 in FIG. 15). At this time, the first post electrode parts 313a are formed only in the openings 312a in the first dry film 310 (step S4 in FIG. 15). The first post electrode parts 313a are formed so that their upper surfaces are lower than an upper surface 310a of the first dry film 310.

Next, as illustrated in FIG. 17A, a second dry film 311 is attached to the entire surface of the wafer (step S5 in FIG. 15).

Figure 17B:
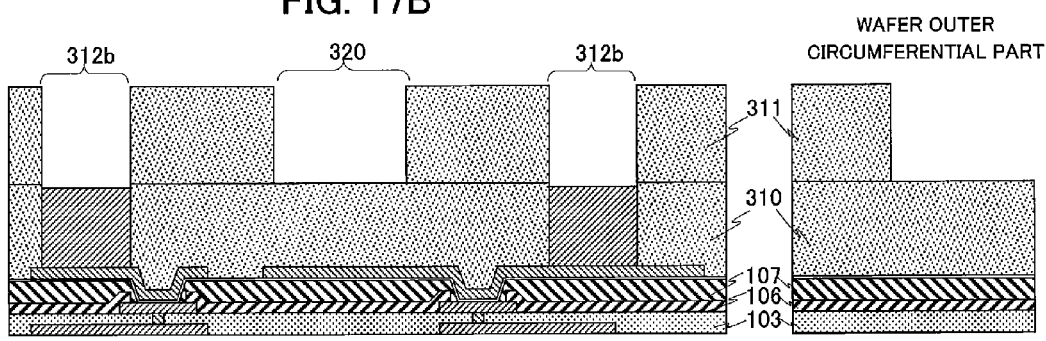

Next, as illustrated in FIG. 17B, openings (i.e., holes) 312b are formed over the openings 312a of the first dry film 310 and slits 320 are formed as long grooves on the second dry film 311 by using lithographic techniques (steps S21 and S22 in FIG. 15). The openings 312b penetrate the second dry film 311 in a thickness direction of the second dry film 311. FIG. 19 illustrates an example of the slits 320. As illustrated in FIG. 19, the slits 320 may be arranged in a grid pattern or in grid-like fashion so that each of square regions surrounded by neighboring slits 320 includes a predetermined number of post electrodes, i.e., one or more post electrodes. An object of forming the slits 320 is to avoid problems, such as a wafer warpage or deformation, caused by internal stress that arises due to shrinkage of the dry film when the dry films are attached in layers to the semiconductor wafer. The arrangement of the slits 320 is not limited to the example shown in FIG. 19.

Figure 17C:
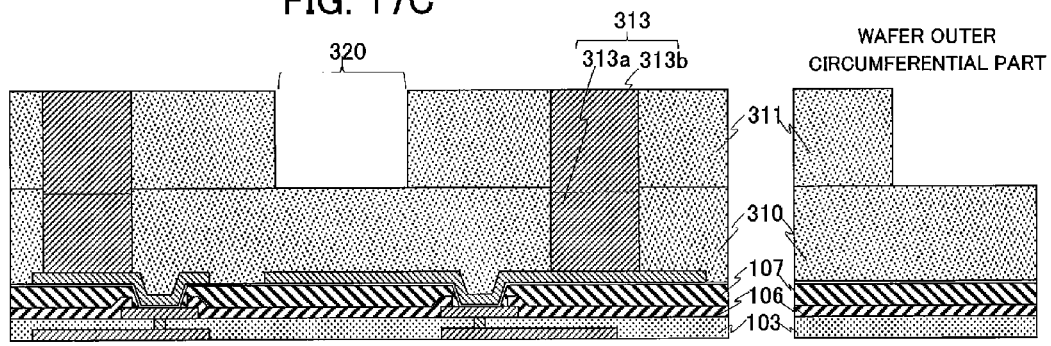

Next, as illustrated in FIG. 17C, second post electrode parts 313b as second pillar-shaped parts are formed on the first post electrode parts 313a respectively by plating such as electroplating (step S8 in FIG. 15). At this time, the second post electrode parts 313b are formed in the openings of the second dry film 311. It is desirable that upper surfaces of the second post electrode parts 313b should be higher than an upper surface of the second dry film 311.

Figure 17D:
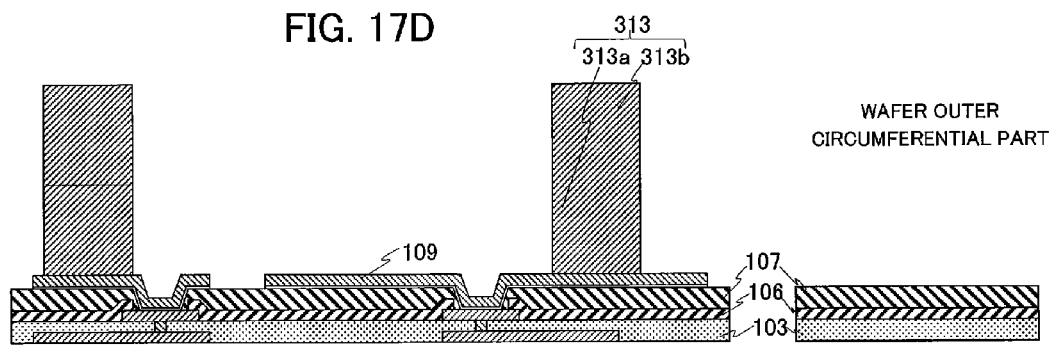

Next, as illustrated in FIG. 17D, the second and first dry films 311 and 310 are removed by carrying out chemical liquid treatment (step S9 in FIG. 15), and then the UBM film 108 is removed while the re-distribution wiring layer 109 functions as a stopper film.

Next, as illustrated in FIG. 18A, an additional component 314 is mounted on the re-distribution wiring layer 109 (step S10 in FIG. 15) or on the substrate.

Thereafter, as illustrated in FIG. 18B, the entire surface of the wafer is sealed with a molding resin 315 such as a sealing resin (step S11 in FIG. 15). Then, the processes as illustrated in FIGS. 3A to 3D are carried out (steps S12 and S13 in FIG. 6). The WL-CSP device with pillar-shaped components in which the additional component is mounted on the re-distribution wiring layer and sealed with the molding resin is thus manufactured by the above-described processes.

《3-2》 Modified Example of Second Embodiment

FIG. 20 is a flowchart illustrating a modified example of the method of manufacturing the device with pillar-shaped components according to the second embodiment. FIGS. 21A to 21E are schematic sectional views illustrating processes of the modified example of the method of manufacturing the device with pillar-shaped components according to the second embodiment, FIGS. 22A to 22E are schematic sectional views illustrating processes of the modified example of the method of manufacturing the device with pillar-shaped components according to the second embodiment, and FIGS. 23A to 23D are schematic sectional views illustrating processes of the modified example of the method of manufacturing the device with pillar-shaped components according to the second embodiment. FIG. 22A illustrates the process subsequent to the process illustrated in FIG. 21E, and FIG. 23A illustrates the process subsequent to the process illustrated in FIG. 22D. In each of FIGS. 21A to 21E, FIGS. 22A to 22E, and FIGS. 23A to 23D, a region in a center part (excluding an outer circumferential part) of a wafer is illustrated on the left and a region near the outer circumferential part of the wafer is illustrated on the right.

Figure 21A:
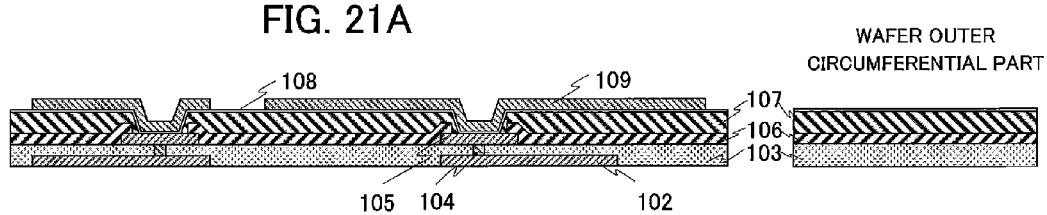
FIGS. 21A to 21E are schematic sectional views illustrating processes of the modified example of the method of manufacturing the device with pillar-shaped components according to the second embodiment.
Figure 22A:
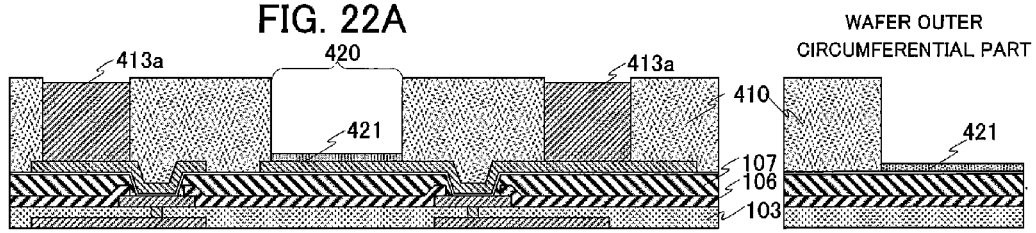
FIGS. 22A to 22D are schematic sectional views illustrating processes of the modified example of the method of manufacturing the device with pillar-shaped components according to the second embodiment.

FIG. 21A illustrates a wafer fabricated by the same processes as the processes in the first embodiment illustrated in FIGS. 7A to 7C.

Figure 21B:
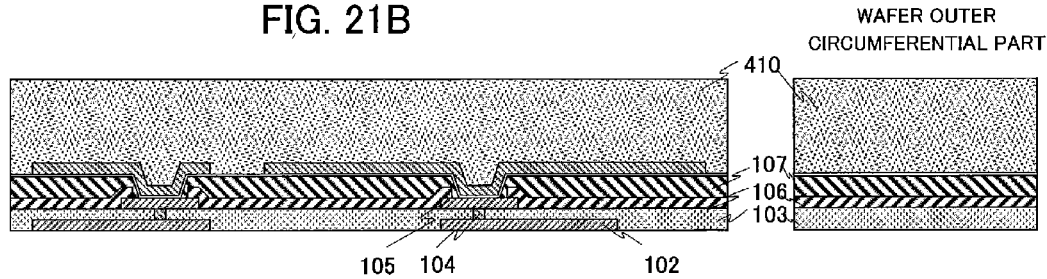

Next, as illustrated in FIG. 21B, a first dry film 410 is attached to the entire surface of the wafer on which the re-distribution wiring layer 109 is formed (step S1 in FIG. 20).

Figure 21C:
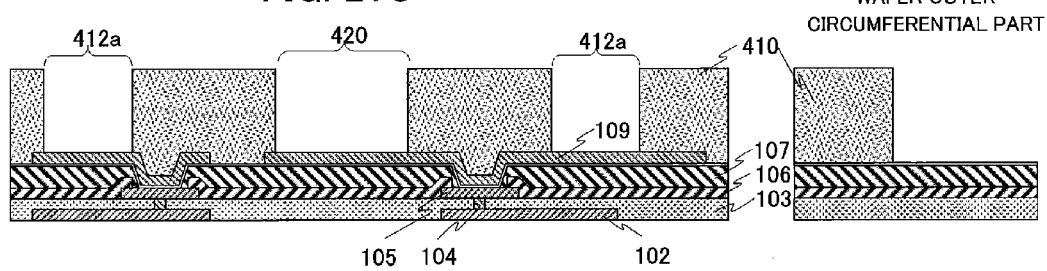

Next, as illustrated in FIG. 21C, openings (i.e., holes) 412a are formed in the re-distribution wiring layer 109 and slits 420 are formed as long grooves on the first dry film 410 by using lithographic techniques. The openings 412a penetrate the first dry film 410 in a thickness direction of the first dry film 410. In the outer circumferential part of the wafer, a resist removal part is formed (steps S31 and S32 in FIG. 20).

Figure 21D:
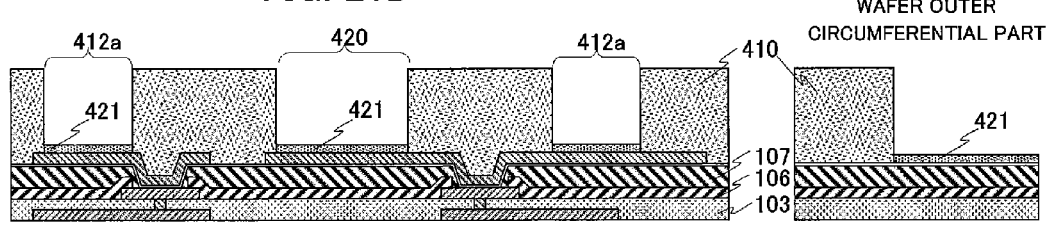
Figure 21E:
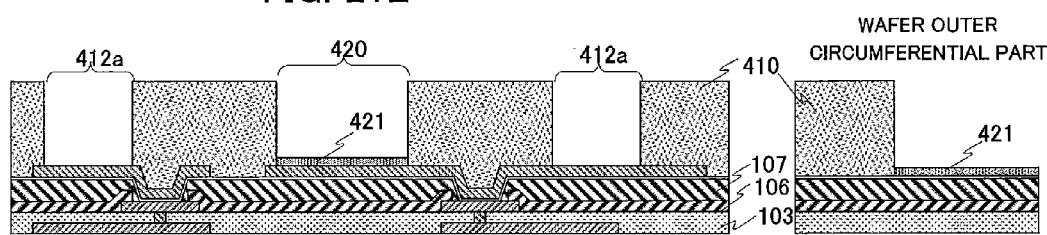

Next, as illustrated in FIG. 21D, a resist 421 is applied on the entire surface of the wafer. Then, as illustrated in FIG. 21E, the resist 421 is removed from the openings 412a by patterning process for forming post electrodes in the openings 412a (step S33 in FIG. 20).

Next, as illustrated in FIG. 22A, first post electrode parts 413a as first pillar-shaped parts are formed by plating such as electroplating. At this time, the first post electrode parts 413a are formed in the openings of the first dry film 410 (step S4 in FIG. 20).

Figure 22B:
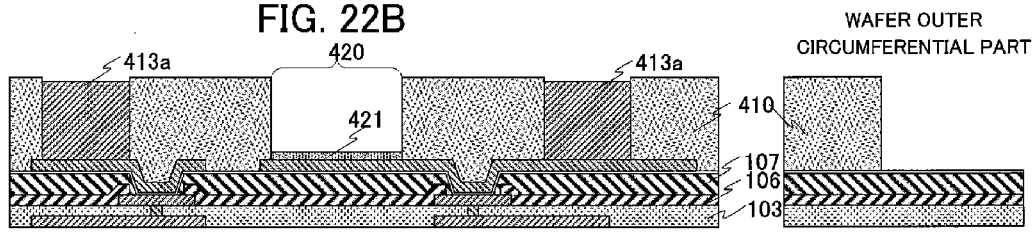
Figure 22C:
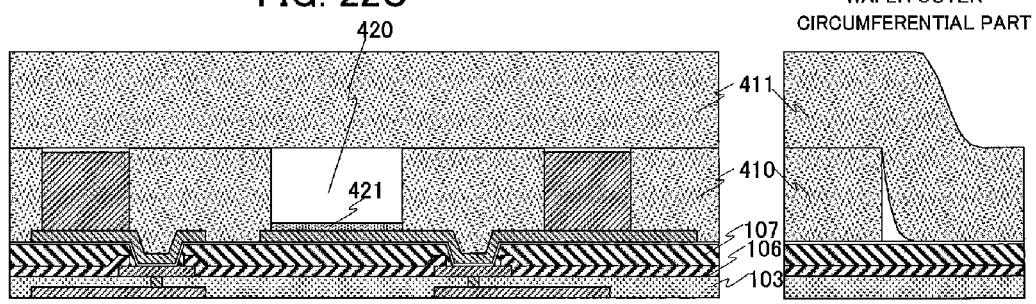
Figure 23A:
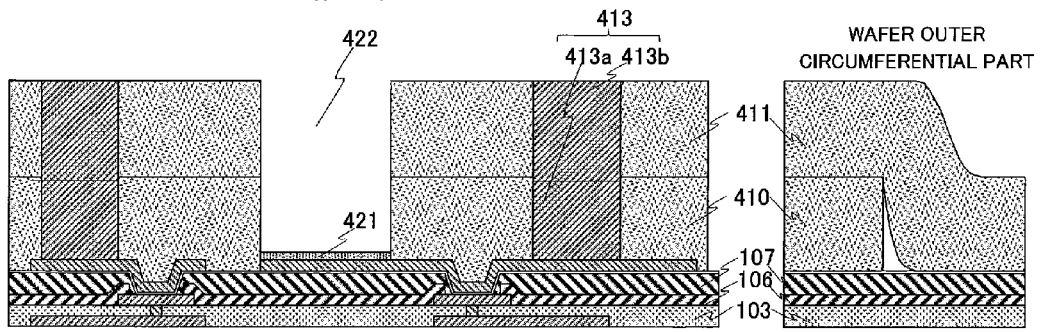
FIGS. 23A to 23D are schematic sectional views illustrating processes of the modified example of the method of manufacturing a device with pillar-shaped components according to the second embodiment.

Next, as illustrated in FIG. 22B, the resist 421 is removed from the outer circumferential part of the wafer. Then, as illustrated in FIG. 22C, a second dry film 411 is attached to the first dry film 410 (step S5 in FIG. 20). At this time, in the outer circumferential part of the wafer, the second dry film 411 is also attached to a region from which the first dry film 410 is removed, i.e., the second dry film 411 is also attached to the UBM film.

Figure 22D:
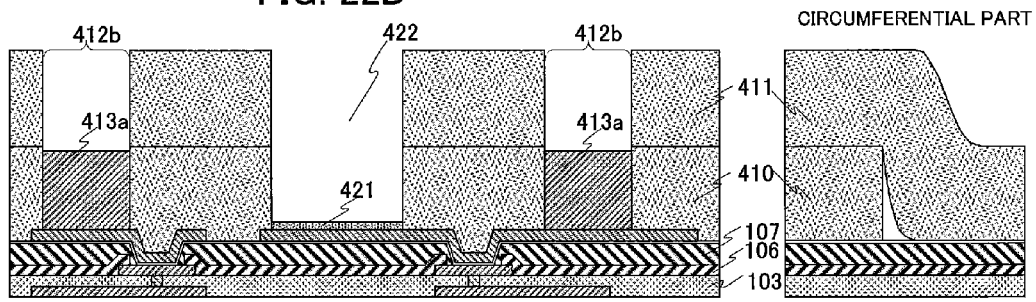
Figure 22E:
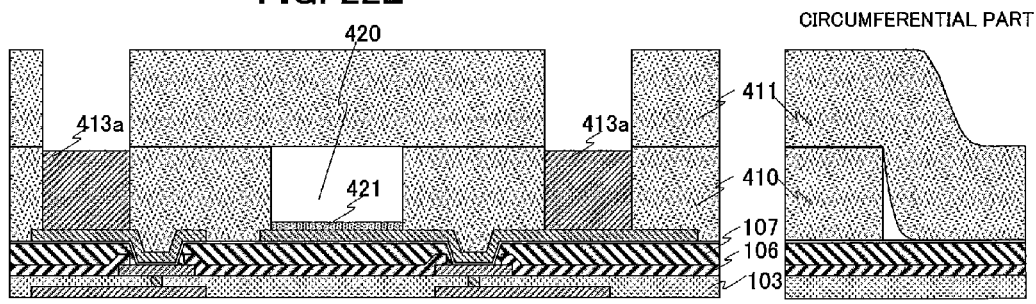
FIG. 22E illustrates another example of FIG. 22D.

Next, as illustrated in FIG. 22D, openings (i.e., holes) 412b are formed over the openings 412a of the first dry film 410 and openings 422 is formed over the slits 420 (steps S34 and S35 in FIG. 20) by using lithographic techniques. The openings 412b penetrate the second dry film 411 in a thickness direction of the second dry film 411. The second dry film may be formed as illustrated in FIG. 22E instead of FIG. 22D. It means that only the openings 412b may be formed over the openings 412a of the first dry film 410 by using lithographic techniques so as to penetrate the second dry film 411 in the thickness direction.

Next, as illustrated in FIG. 23A, second post electrode parts 413b as second pillar-shaped parts are formed on the first post electrode parts 413a respectively by plating such as electroplating (step S8 in FIG. 20). At this time, the second post electrode parts 413b are formed in the openings 412b of the second dry film 411. It is desirable that upper surfaces of the second post electrode parts 413b should be higher than an upper surface of the second dry film 411.

Figure 23B:
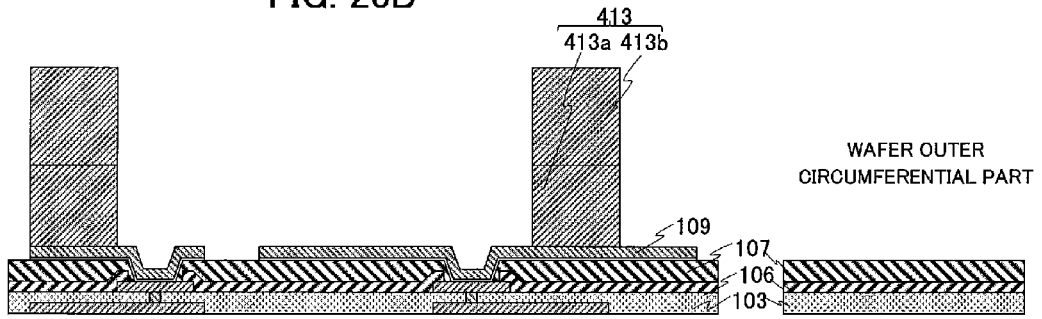

Next, as illustrated in FIG. 23B, the second and first dry films 411 and 410 are removed by carrying out chemical liquid treatment, and then the UBM film 108 is removed while the re-distribution wiring layer 109 functions as a stopper film (step S9 in FIG. 20).

Figure 23C:
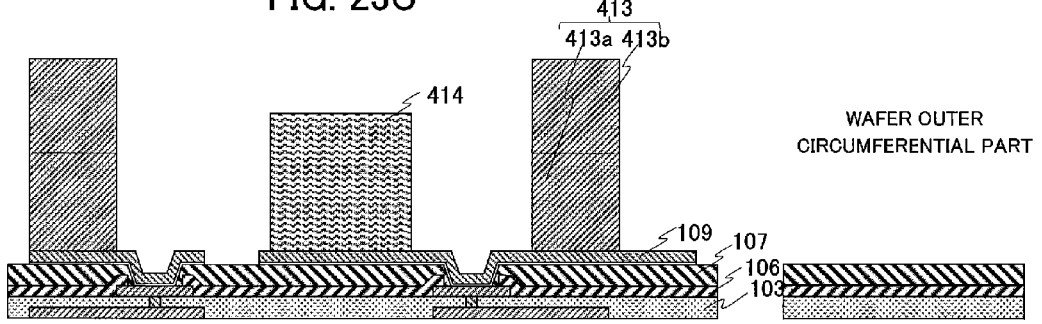

Next, as illustrated in FIG. 23C, an additional component 414 is mounted on the re-distribution wiring layer 109 (step S10 in FIG. 20).

Figure 23D:
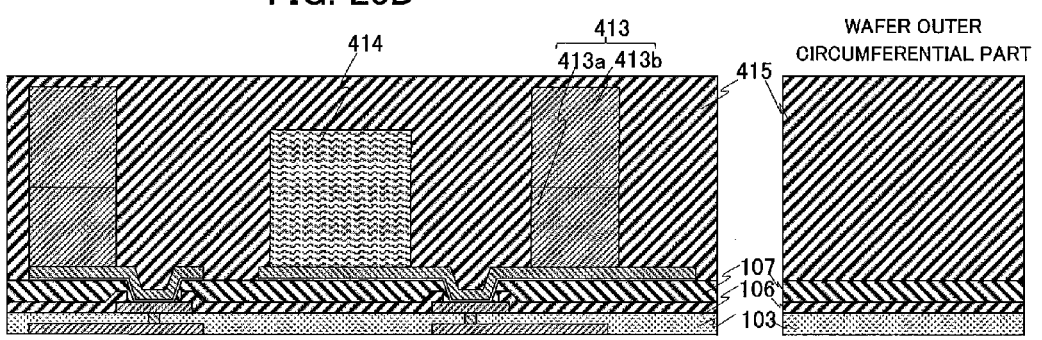

Then, as illustrated in FIG. 23D, the entire surface of the wafer is sealed with a molding resin 415 (step S11 in FIG. 20).

Then, the processes as illustrated in FIGS. 3A to 3D are carried out (steps S12 and S13 in FIG. 20). The WL-CSP device with pillar-shaped components in which an additional component is mounted on the re-distribution wiring layer or on the substrate and sealed with the molding resin is thus manufactured by these processes.

《3-3》 Effects of Second Embodiment

Figure 24:
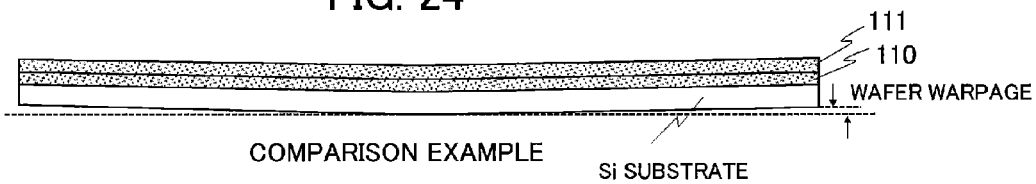
FIG. 24 is a side view schematically illustrating a warpage of a semiconductor wafer which may be caused when two dry films are attached in layers to the semiconductor wafer.
Figure 25:
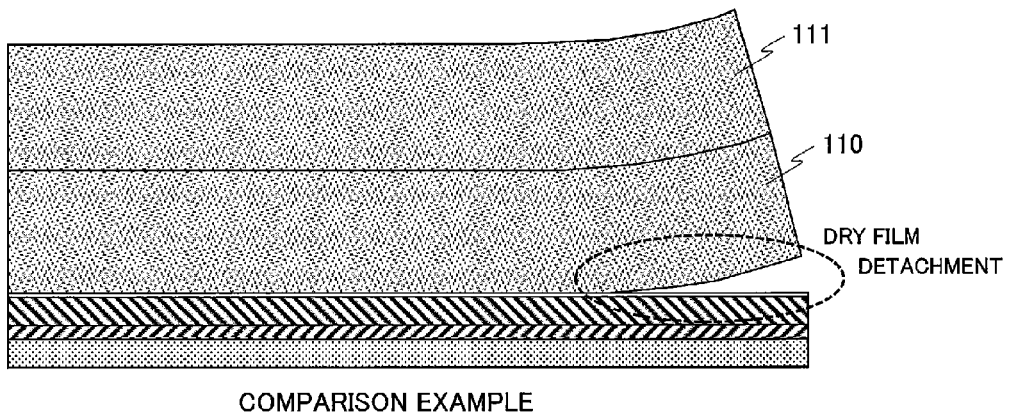
FIG. 25 is a side view schematically illustrating dry film detachment which may be caused when the two dry films are attached in layers to the semiconductor wafer.
Figure 26:
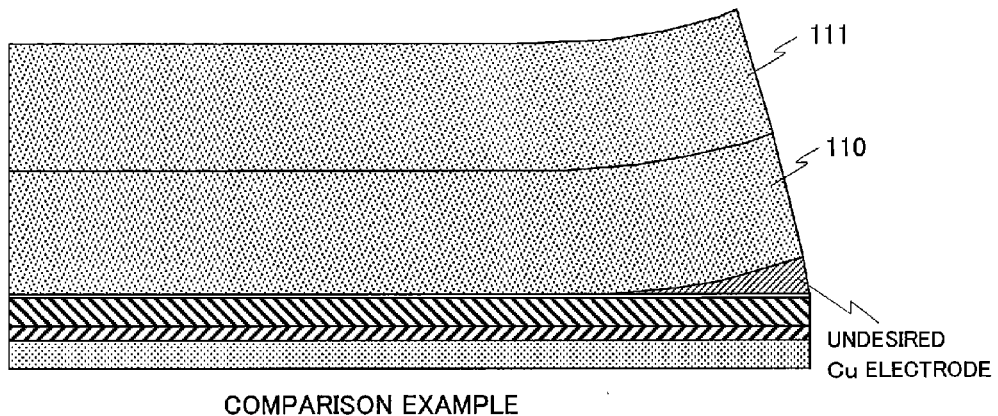
FIG. 26 is a side view schematically illustrating an undesired Cu electrode formed in a gap between the dry film and the wafer in a plating process when the dry film detachment is caused.
Figure 27A:
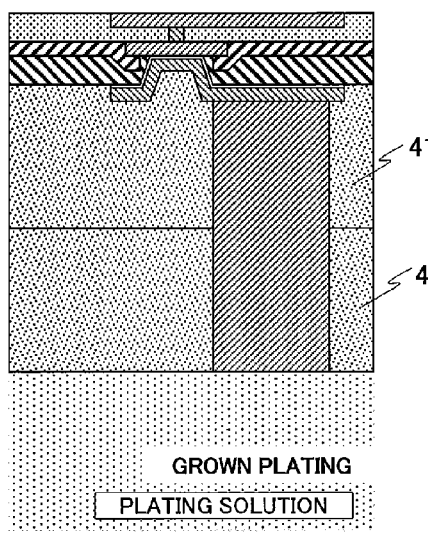
FIG. 27A is a diagram illustrating a normal plating process.
Figure 27B:
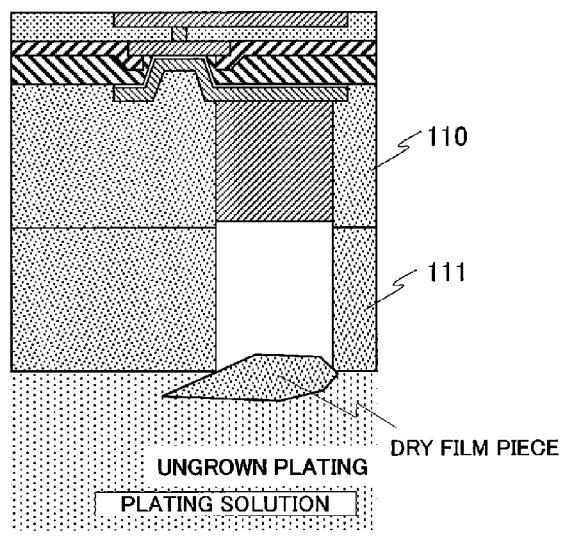
FIG. 27B is a diagram illustrating an undesired state where a piece of the dry film covers a hole.

FIG. 24 is a side view schematically illustrating a warpage or deformation of a semiconductor wafer which may be caused when two dry films are attached in layers to the semiconductor wafer. FIG. 25 is a side view schematically illustrating dry film detachment which may be caused when the two dry films are attached in layers to the semiconductor wafer. FIG. 26 is a side view schematically illustrating an undesired Cu electrode which is formed in a gap between the dry film and the wafer in a plating process when the dry film detachment is caused. FIG. 27A is a diagram illustrating a normal plating process; and FIG. 27B is a diagram illustrating an undesired state where a piece of the dry film covers a hole.

For example, as illustrated in FIG. 3D, in a case where the post electrode of a sufficient height for mounting the additional component is formed by using the thick dry films 110 and 111, considerable internal stress in the dry films 110 and 111 in layers causes a wafer warpage. In addition, the internal stress concentrates at an end part of the dry films 110 and 111 (i.e., near a wafer edge part) and it may result in detachment of a part of the dry films 110 and 111 near the wafer edge part (i.e., near an outer circumferential part of the wafer) as illustrated in FIG. 25. The detachment of the dry films 110 and 111 may cause the following problems. A detached piece of the dry film gets in a plating solution, an opening is undesirably covered by the piece and plating is not normally grown, as illustrated in FIG. 27B. Moreover, an undesired post electrode (e.g. Cu electrode) may be grown in a gap between the wafer and the dry films 110 and 111 as illustrated in FIG. 26, and the wafer may be broken from the undesired Cu electrode in a process after a post electrode is formed by plating. Furthermore, the internal stress of the thick dry films 110 and 111 may cause a wafer warpage. Such a wafer warpage may cause an error in vacuum adsorption or the like in the device after the dry film is attached and may cause a problem in a workflow.

To cope with such problems, in the second embodiment, the post electrodes are formed by using the two dry films in layers. Notwithstanding the internal stress of the thick dry film concentrates at a part of the outer circumferential part of the wafer, the internal stress can be distributed by removing a part of the second dry film in the outer circumferential part. At this time, the outer circumferential part is covered by the first dry film and an undesired post electrode can be prevented from growing in the outer circumferential part. In addition, by forming the slits in a grid pattern on the second dry film, the internal stress caused in the dry film can be distributed and a wafer warpage amount of the entire wafer can be reduced. The warpage preventing effect of the slits is effective when a total thickness of the first and second dry films 310 and 311 is 100 μm or more, especially 150 μm or more.

Moreover, when a part of the first dry film in the outer circumferential part is removed, the second dry film is closely adhered to the UBM film 108 in the outer circumferential part and covers an end surface of the first dry film. This can prevent the plating solution from soaking through the interface between the dry films, as well as reduce the internal stress.

As described above, in the second embodiment, by removing a part of the dry film in the outer circumferential part, detachment of the dry film due to internal stress concentration can be prevented and a breakage of the wafer due to a detached piece of the dry film in the plating solution or a growth of an undesired post electrode can be prevented. Moreover, by forming the slits in a grid pattern on the second dry film, a wafer warpage due to the internal stress of the dry film can be prevented and a problem in a workflow can be prevented.

《4》 One Aspect of Present Invention

A method of manufacturing a device with pillar-shaped components will be described below. A detail of this method is described in the first embodiment. In one aspect of the present invention, a method of manufacturing a device with pillar-shaped components, comprises:

attaching a first photoresist dry film to a substrate;

forming first holes penetrating the first photoresist dry film in a thickness direction of the first photoresist dry film;

forming first pillar-shaped parts in the first holes by plating;

thereafter attaching a second photoresist dry film to an upper surface of the first photoresist dry film, thereby forming a multilayered structure of photoresist dry films;

forming second holes penetrating the second photoresist dry film in a thickness direction of the second photoresist dry film so as to be connected with said the first holes respectively; and forming second pillar-shaped parts on the first pillar-shaped parts by plating;

wherein said forming of the first pillar-shaped parts is performed so that upper surfaces of the first pillar-shaped parts are lower than the upper surface of the first photoresist dry film.

In the method, it is preferable that said forming of the second pillar-shaped parts be performed so that upper surfaces of the second pillar-shaped parts are higher than an upper surface of the second photo resist dry film.

In the method, it is preferable that said forming of the second pillar-shaped parts be performed so that the upper surfaces of the second pillar-shaped parts are higher than an upper surface of the second photoresist dry film.

The method may further comprise:

removing the second photoresist dry film and the first photoresist dry film;

mounting an additional component on the substrate;

sealing the additional component and the pillar-shaped components composed of the first and second pillar-shaped parts with a molding resin, thereby forming a sealed structural body; and applying chemical mechanical polishing to the sealed structural body.

In the above method, after said applying of chemical mechanical polishing, a length of the second pillar-shaped parts is greater than a length of the first pillar-shaped parts.

In the above method, said forming of the first pillar-shaped parts may performed repeatedly a plurality of times so as to form a multilayered structure of the first photoresist dry films, and thereafter said forming of the second pillar-shaped parts is performed.

In the above method, said forming of the first holes is a step of forming a plurality of first holes, and said forming of the first pillar-shaped parts is a step of forming a plurality of first pillar-shaped parts at a same process so that any of upper surfaces of the first pillar-shaped parts are lower than the upper surface of the first photoresist dry film.

In the above method, said forming of the second holes is a step of forming a plurality of second holes, and said forming of the second pillar-shaped parts is a step of forming a plurality of second pillar-shaped parts at a same process so that any of upper surfaces of the second pillar-shaped parts are lower than the upper surface of the first photoresist dry film.

In the above method, the pillar-shaped components may be post electrodes or pillar-shaped metal components for radiating heat. Further, in the above method, the substrate may be a semiconductor substrate.

《5》 Another Aspect of Present Invention

A method of manufacturing a device with pillar-shaped components will be described below. A detail of this method is described in the first embodiment. In another aspect of the present invention, a method of manufacturing the device with pillar-shaped components, comprises:

attaching a plurality of photoresist dry films in layers to a substrate so as to form a multilayered structure of the photoresist dry films on the substrate;

forming holes penetrating the multilayered structure of the photoresist dry films in a thickness direction of the multilayered structure;

forming the pillar-shaped components in the holes by plating; and forming a slit on layer of the multilayered structure of the photoresist dry films.

In the above method, said forming of the pillar-shaped components includes:

attaching a first photoresist dry film of the multilayered structure of the photoresist dry films to the substrate;

forming first holes penetrating the first photoresist dry film in a thickness direction of the first photoresist dry film;

forming first pillar-shaped parts as parts of the pillar-shaped components in the first holes by plating;

attaching a second photoresist dry film of the multilayered structure of the photoresist dry films to an upper surface of the first photoresist dry film;

forming second holes penetrating the second photoresist dry film in a thickness direction of the second photoresist dry film so that the second holes are connected to the first holes respectively; and forming second pillar-shaped parts as parts of the pillar-shaped components on the first pillar-shaped parts respectively by plating.

In the above method, it is preferable that said forming of the first pillar-shaped parts be performed so that upper surfaces of the first pillar-shaped parts are lower than the upper surface of the first photoresist dry film.

In the above method, it is preferable that said forming of the first pillar-shaped parts be performed repeatedly a plurality of times so as to form a multilayered structure of the first pillar-shaped parts, and thereafter said forming of the second pillar-shaped parts is performed.

In the above method, said forming of the slit is performed on a first photoresist dry film which is a photoresist dry film attached to the substrate, out of the multilayered structure of the photoresist dry films.

In the above method, said forming of the slits is performed on a second photoresist dry film which is the second film counted from a side of the substrate in the multilayered structure of the photoresist dry films.

In the above method, the slit includes a plurality of first linear grooves extending in a first direction, and a plurality of second linear grooves extending in a second direction perpendicular to the first direction.

The method may further comprise:
removing the plurality of photoresist dry films;
mounting an additional component on the substrate or a wiring layer disposed on the substrate;
sealing the additional component and the pillar-shaped components with a molding resin, thereby forming a sealed structural body; and
applying chemical mechanical polishing to the sealed structural body.

The method may comprise: removing a predetermined width of photoresist dry film selected from the multilayered structure of the photoresist dry films on a wafer edge side.

In the above method, said removing of the predetermined width of photoresist dry film is a step of removing a predetermined width of the second photoresist dry film or another photoresist dry film disposed above the second photoresist dry film.

In the above method, said removing of the predetermined width of photoresist dry film is a step of removing the first dry film, and
the method may further comprise: forming a coating layer to cover a region where the predetermined width of the first dry film is removed.

In the above method, said removing of the predetermined width of photoresist dry film is a step of removing the first dry film, and the predetermined width of the first dry film on the wafer edge side is covered by the second photoresist dry film or another photoresist dry film disposed above the second photoresist dry film.

The method may further comprise: forming a coating layer on a bottom part of the slit.

In further aspect of the present invention, a method of manufacturing the device with pillar-shaped components, comprises:
attaching a first photoresist dry film to a substrate;
attaching a second photoresist dry film to the first photoresist dry film;
forming holes penetrating the first and second photoresist dry films in a thickness direction of the first and second photoresist dry films; and
forming pillar-shaped components in the holes by plating; wherein:
a whole region above the substrate includes a first region where the pillar-shaped components are formed on any of the first and second photoresist dry films by plating and a second region where no pillar-shaped components are formed on any of the first and second photoresist dry films, and
said forming of the holes is performed in both of the first and second regions.

In the above method, the pillar-shaped components may be post electrodes or pillar-shaped metal components for radiating heat. Further, in the above method, the substrate may be a semiconductor substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A device with pillar-shaped post electrodes, comprising:
a substrate;
a wiring layer disposed on the substrate; and
the pillar-shaped post electrodes disposed on the wiring layer, each of the pillar-shaped post electrodes having a bottom surface connected to the wiring layer, a top surface opposed to the bottom surface, and a lateral face part extending from the bottom surface to the top surface to connect the bottom surface and the top surface,
wherein each of the pillar-shaped post electrodes is an integrated pillar-shaped electrode which is a single-body structure electrode comprising directly-joined first and second pillar-shaped parts, and
wherein
the first pillar-shaped part is formed by plating,
the second pillar-shaped part is formed on the first pillar-shaped part by plating,
a lateral face of the first pillar-shaped part and a lateral face of the second pillar-shaped part form the lateral face part, the lateral face of the second pillar-shaped part including a ring-like projection part, the ring-like projection part extending in a circumferential direction of the lateral face of the second pillar-shaped part and projecting outward from the lateral part of the second pillar-shaped part, and
a first area corresponding to the ring-like projection part on a surface of the substrate is within a second area corresponding to the wiring layer on the substrate, the first area being defined on the surface of the substrate when the ring-like projection part is viewed toward the substrate in a direction perpendicular to the surface of the substrate, the second area being defined on the surface of the substrate when the wiring layer is viewed toward the substrate in the direction perpendicular to the surface of the substrate.

2. The device according to claim 1, wherein a length of the second pillar-shaped part is greater than a length of the first pillar-shaped part.

3. The device according to claim 1, wherein each of the pillar-shaped post electrodes further includes a third pillar-shaped part directly joined to a top surface of the second pillar-shaped part by plating.

4. The device according to claim 1, further comprising:
a molding resin covering the lateral face parts of the pillar-shaped-post electrodes; and
solder terminals disposed on the top surfaces of the pillar-shaped post electrodes respectively.

5. The device according to claim 1, further comprising:
an electronic component formed on the wiring layer so as to be mounted outside an area where the pillar-shaped post electrodes are disposed.

6. The device according to claim 5, wherein a height of the electronic component is greater than a height of the first pillar-shaped part.

7. The device according to claim 1, further comprising:
other pillar-shaped post electrodes disposed on the substrate, the other pillar-shaped post electrodes being metal components for radiating heat.

8. The device according to claim 1, wherein the substrate is a semiconductor substrate.

9. A pillar-shaped post electrode formed on a semiconductor substrate, comprising:
a first post electrode part having a circular cylindrical shape and having a top surface and a bottom surface, the bottom surface on a substrate;
a second post electrode part having a circular cylindrical shape and having a top surface and a bottom surface, the bottom surface of the second post electrode part being directly joined to the top surface of the first post electrode part,
wherein a lateral face of the first post electrode part and a lateral face of the second post electrode part form a continuous lateral surface of the pillar-shaped post electrode;

the lateral face of the second post electrode part includes a ring-like projection part, the ring-like projection part being formed at a position apart from a joint position where the first post electrode part and the second post electrode part are directly joined and extending in a circumferential direction of the lateral face of the second post electrode part and projecting outward from the lateral face of the second post electrode part;

the ring-like projection part has a first diameter; and the pillar-shaped post electrode except for the ring-like projection part has a second diameter that is shorter than the first diameter.

10. The pillar-shaped post electrode of claim 9, further comprising a solder terminal on the top surface of the second post electrode part.

11. The pillar-shaped post electrode of claim 10, further comprising a molding resin covering the lateral faces of the first and second post electrode parts.

12. The pillar-shaped post electrode of claim 9, wherein the first and second post electrode parts and the ring-like projection part are plated metal.

13. The pillar-shaped post electrode of claim 9, wherein a height of the second post electrode part is greater than a height of the first post electrode part.

14. The pillar-shaped post electrode of claim 9, further comprising a third post electrode part having a top surface and a bottom surface, the bottom surface of the third post electrode part being directly joined to the top surface of the second post electrode part.

\* \* \* \* \*